US012735636B2

(12) United States Patent
Fang

(10) Patent No.: US 12,735,636 B2
(45) Date of Patent: Sep. 15, 2026

(54) QUANTUM DOT MATERIAL, LIGHT-EMITTING DEVICE AND METHOD FOR MANUFACTURING THE SAME AND DISPLAY APPARATUS

(71) Applicant: BOE TECHNOLOGY GROUP CO., LTD., Beijing (CN)

(72) Inventor: Bing Fang, Beijing (CN)

(73) Assignee: BOE TECHNOLOGY GROUP CO. , LTD., Beijing (CN)

(*) Notice: Subject to any disclaimer, the term of this patent is extended or adjusted under 35 U.S.C. 154(b) by 628 days.

(21) Appl. No.: 18/260,618

(22) PCT Filed: Jun. 29, 2022

(86) PCT No.: PCT/CN2022/102256

§ 371 (c)(1),
(2) Date: Jul. 7, 2023

(87) PCT Pub. No.: WO2024/000240

PCT Pub. Date: Jan. 4, 2024

(65) Prior Publication Data

US 2025/0084301 A1 Mar. 13, 2025

(51) Int. Cl.

*C09K 11/06* (2006.01)
*H10K 50/115* (2023.01)
*H10K 50/125* (2023.01)
*H10K 71/00* (2023.01)

(52) U.S. Cl.

CPC ............ *C09K 11/06* (2013.01); *H10K 50/115* (2023.02); *H10K 50/125* (2023.02); *H10K 71/00* (2023.02); *C09K 2211/1011* (2013.01)

(58) Field of Classification Search

CPC ............ C09K 11/06; C09K 2211/1011; H10K 50/125; H10K 50/115; H10K 71/00
USPC .................................................. 252/301.4 R
See application file for complete search history.

(56) References Cited

U.S. PATENT DOCUMENTS

2022/0127525 A1 4/2022 Wang
2022/0165952 A1 5/2022 Mei

FOREIGN PATENT DOCUMENTS

CN 102263205 A 11/2011
CN 102329411 A 1/2012
CN 105568763 B 11/2017
CN 112300784 A 2/2021
CN 112410019 A 2/2021
CN 113046058 A 6/2021

*Primary Examiner* — Anita Nassiri-Motlagh
(74) *Attorney, Agent, or Firm* — XSENSUS LLP

(57) ABSTRACT

A quantum dot material is provided. The quantum dot material includes quantum dot bodies and a ligand material coordinated to the quantum dot bodies. The ligand material includes a coordination group and a photosensitive group bound to the coordination group. The photosensitive group is configured to undergo a cyclization addition reaction under light illumination to form a cross-linked ligand. A solubility of the cross-linked ligand in a solvent is less than a solubility of the ligand material in the solvent.

20 Claims, 5 Drawing Sheets

QUANTUM DOT MATERIAL, LIGHT-EMITTING DEVICE AND METHOD FOR MANUFACTURING THE SAME AND DISPLAY APPARATUS

CROSS-REFERENCE TO RELATED APPLICATION

The application is a national phase entry under 35 USC 371 of International Patent Application No. PCT/CN2022/102256 filed on Jun. 29, 2022, which is incorporated herein by reference in its entirety.

TECHNICAL FIELD

The present disclosure relates to the field of display technologies, and in particular, to a quantum dot material, a light-emitting device and a method for manufacturing the same and a display apparatus.

BACKGROUND

Light-emitting diodes such as organic light-emitting diodes (OLEDs), quantum dot light-emitting diodes (QLEDs) and quantum dot organic light-emitting diodes (QDOLEDs) have characteristics of self-luminescence, wide viewing angle, quick response, high luminous efficiency, low working voltage, thin substrate, capability of being used for manufacturing large-sized and bendable substrates and simple manufacturing process, and are increasingly widely used in recent years.

SUMMARY

In an aspect, a quantum dot material is provided. The quantum dot material includes quantum dot bodies and a ligand material coordinated to the quantum dot bodies. The ligand material includes a coordination group and a photosensitive group bound to the coordination group. The photosensitive group is configured to undergo a cycloaddition reaction under light illumination to form a cross-linked ligand. A solubility of the cross-linked ligand in a solvent is less than a solubility of the ligand material in the solvent.

In some embodiments, the ligand material is any one of materials represented by a following general formula (I):

(I)

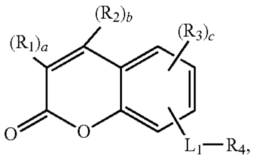

where $R_1$, $R_2$ and $R_3$ are same or different, and are each independently any one of fluorine, chlorine, bromine, a methoxyl group and a cyano group, $L_1$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$, $R_4$ is any one of a sulfhydryl group, a carboxyl group and an amino group, and $R_4$ is a coordination group for being be coordinately bound to the quantum dot body; and values of a and b are each independently any one of 0 and 1, and a value of c is any one of 0, 1, 2 and 3.

In some embodiments, the cross-linked ligand formed by the cycloaddition reaction of photosensitive groups of the ligand material represented by the general formula (I) under light illumination is any one of cross-linked ligands represented by a following general formula (II):

(II)

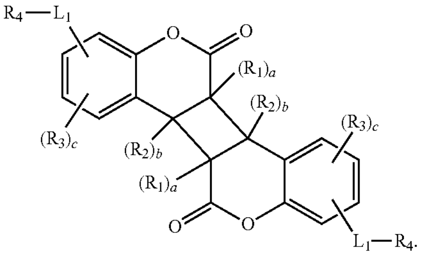

In some embodiments, the ligand material is any one of materials represented by a following general formula (III):

(III)

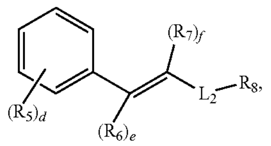

where $R_5$ is any one of fluorine, chlorine, bromine, a methoxyl group and a cyano group; $R_6$ and $R_7$ are same or different, and at least one of $R_6$ and $R_7$ is a cyano group; $L_2$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$, $R_8$ is any one of a sulfhydryl group, a carboxyl group and an amino group, and $R_8$ is a coordination group for being coordinately bound to the quantum dot body; a value of d is any one of 0, 1, 2, 3, 4 and 5; and values of e and f are each independently any one of 0 and 1.

In some embodiments, the cross-linked ligand formed by the cycloaddition reaction of photosensitive groups of the ligand material represented by the general formula (III) under light illumination is any one of cross-linked ligands represented by a following general formula (IV):

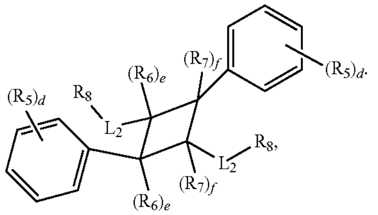

In some embodiments, the ligand material is any one of materials represented by a following general formula (V):

(V)

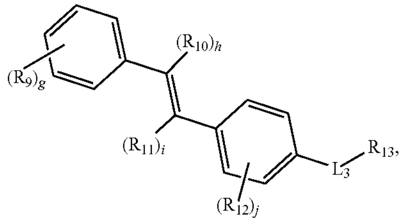

where $R_9$ and $R_{12}$ are same or different, and are each independently any one of fluorine, chlorine, bromine, a methoxyl group and a cyano group, $R_{10}$ and $R_{11}$ are same or different, and at least one of $R_{10}$ and $R_{11}$ is a cyano group; $L_3$ is any one of a single bond, an ester bond with a carbon chain of $C_1$ to $C_{20}$, an amido bond with a carbon chain of $C_1$ to $C_{20}$ and an ether bond with a of carbon chains $C_1$ to $C_{20}$, $R_{13}$ is any one of a sulfhydryl group, a carboxyl group and an amino group, and $R_{13}$ is a coordination group for being coordinately bound to the quantum dot body; a value of g is any one of 0, 1, 2, 3, 4 and 5; a value of j is any one of 0, 1, 2, 3 and 4; and values of h and i are each independently any one of 0 and 1.

In some embodiments, the cross-linked ligand formed by the cycloaddition reaction of photosensitive groups of the ligand material represented by the general formula (V) under light illumination is any one of cross-linked ligands represented by a following general formula (VI):

(VI)

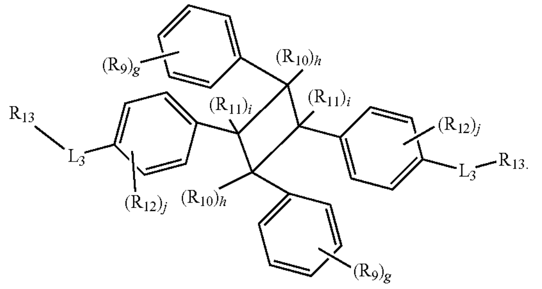

In some embodiments, a mass ratio of the ligand material to the quantum dot body is in a range of 1:10 to 3:20, inclusive.

In some embodiments, the solvent includes dichloromethane.

In some embodiments, the photosensitive group of the ligand material is configured to undergo the cycloaddition reaction under ultraviolet light illumination.

In another aspect, a light-emitting device is provided. The light-emitting device includes a functional layer. The function layer includes a cross-linked quantum dot material formed by the ligand material and the quantum dot bodies of the quantum dot material according to any one of the above embodiments. The quantum dot bodies are bound to the cross-linked ligand formed by the ligand material to form the cross-linked quantum dot material with a network structure through.

In some embodiments, a structure of the cross-linked quantum dot material formed by the cross-linked ligand and the quantum dot bodies is any one of structures represented by a following general formulae (VII):

(VII)

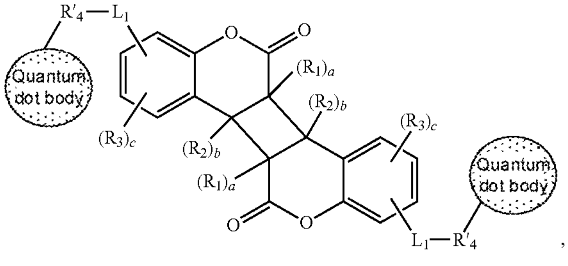

, where $R_1$, $R_2$ and $R_3$ are same or different, and are each independently any one of fluorine, chlorine, bromine, a methoxyl group and a cyano group; $L_1$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$; $R'_4$ is a group formed from by coordination connection between a coordination group $R_4$ and a quantum dot body, $R_4$ is any one of a sulfhydryl group, a carboxyl group and an amino group, and $R'_4$ is a structure by removal of a hydrogen atom from any one of the sulfhydryl group, the carboxyl group and the amino group; and values of a and b are each independently 0 or 1, and a value of c is any one of 0, 1, 2 and 3.

In some embodiments, a structure of the cross-linked quantum dot material formed by the cross-linked ligand and the quantum dot bodies is any one of structures represented by a following general formulae (VIII):

(VIII)

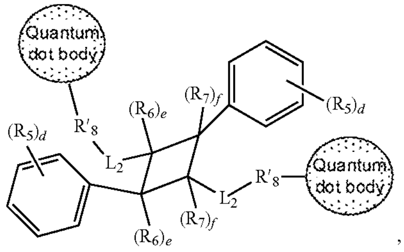

, where $R_5$ is any one of fluorine, chlorine, bromine, a methoxyl group and a cyano group; $R_6$ and $R_7$ are same or different, and at least one of Re and $R_7$ is a cyano group; $L_2$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$; $R'_8$ is a group formed by coordination connection between a coordination group $R_8$ and a quantum dot body, $R_8$ is any one of a sulfhydryl group, a carboxyl group and an amino group, and $R'_8$ is a structure formed by removal of a hydrogen atom from any one of the sulfhydryl group, the carboxyl group and the amino group; a value of d is any one of 0, 1, 2, 3, 4 and 5; and values of e and f are each independently 0 or 1.

In some embodiments, a structure of the cross-linked quantum dot material formed by the cross-linked ligand and the quantum dot bodies is any one of structures represented by a following general formulae (IX):

(IX)

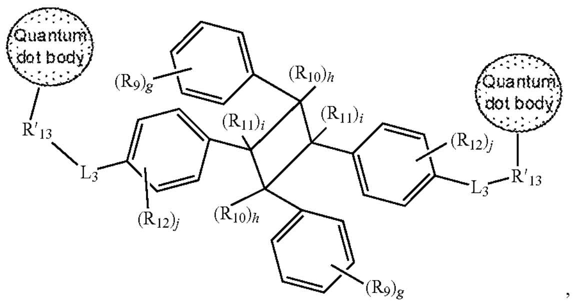

where $R_9$ and $R_{12}$ are same or different, and are each independently any one of fluorine, chlorine, bromine, a methoxyl group and a cyano group; $R_{10}$ and $R_{11}$ are same or different, and at least one of $R_{10}$ and $R_{11}$ is a cyano group; $L_3$ is any one of a single bond, an ester bond with a carbon chain of carbon chains $C_1$ to $C_{20}$, an amido bond with a carbon chain of carbon chains $C_1$ to $C_{20}$ and an ether bond with a carbon chain of carbon chains $C_1$ to $C_{20}$; $R'_{13}$ is a group formed by coordination connection between a coordination group $R_{13}$ and a quantum dot body, $R_{13}$ is any one of a sulfhydryl group, a carboxyl group and an amino group, and $R'_{13}$ is a structure formed by removal of a hydrogen atom from any one of the sulfhydryl group, the carboxyl group and the amino group; a value of g is any one of 0, 1, 2, 3, 4 and 5; a value of j is any one of 0, 1, 2, 3 and 4; and values of h and i are each independently 0 or 1.

In some embodiments, the light-emitting device further includes a first electrode and a second electrode. The functional layer is a light-emitting layer and disposed between the first electrode and the second electrode. The light-emitting layer includes a first sub-pixel light-emitting layer, a second sub-pixel light-emitting layer and a third sub-pixel light-emitting layer. The first sub-pixel light-emitting layer is configured to emit one of red light, blue light and green light; the second sub-pixel light-emitting layer is configured to emit another one of the red light, the blue light and the green light; and the third sub-pixel light-emitting layer is configured to emit a last one of the red light, the blue light and the green light.

In some embodiments, the light-emitting device further includes a color film layer. The color film layer is provided on a light-exit side of the light-emitting layer.

In some embodiments, the functional layer is a color film layer. The light-emitting device further includes an excitation light source. The color film layer is disposed on a light-exit side of the excitation light source.

In some embodiments, the excitation light source includes a light-emitting diode device.

In yet another aspect, a method for manufacturing a light-emitting device is provided. The method for manufacturing the light-emitting device including: forming a functional layer. Forming the functional layer includes: performing a coating process with a quantum dot material to form an initial functional layer, the quantum dot material being the quantum dot material according to any one of the above embodiments; performing an exposure process on the initial functional layer by using a mask; and performing a development process in a solvent, a material of the initial functional layer in a non-exposed region being dissolved in the solvent, and a material of the initial functional layer in an exposed region being undissolved in the solvent, so that a pattern is formed to obtain the functional layer.

In some embodiments, before forming the functional layer, the method further includes: performing a ligand material exchange process. Performing the ligand material exchange process includes: preparing an initial solution, the initial solution including a quantum dot body containing an original ligand material; adding a solution containing the ligand material to the initial solution; and replacing the original ligand material, by the ligand material, on the quantum dot body, so that the coordination group of the ligand material is bound to the quantum dot body to obtain the quantum dot material.

In yet another aspect, a display apparatus is provided. The display apparatus includes light-emitting devices each as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person having ordinary skill in the art can obtain other drawings according to these accompanying drawings. In addition, the accompanying drawings in the following description may be regarded as schematic diagrams, but are not limitations on an actual size of a product, an actual process of a method and an actual timing of a signal involved in the embodiments of the present disclosure.

DETAILED DESCRIPTION

Figure 1:
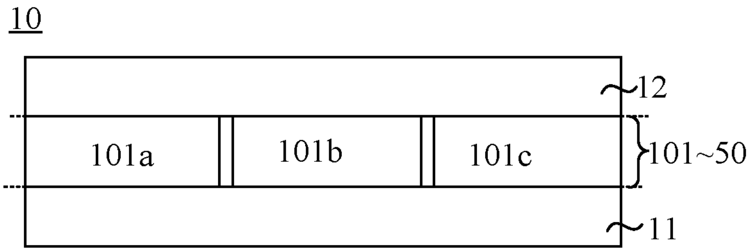
FIG. 1 is a structural diagram of a light-emitting device, in accordance with some embodiments of the present disclosure.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term “comprise” and other forms thereof such as the third-person singular form “comprises” and the present participle form “comprising” are construed as an open and inclusive meaning, i.e., “including, but not limited to”. In the description of the specification, the terms such as “one embodiment”, “some embodiments”, “exemplary embodiments”, “example”, “specific example” or “some examples” are intended to indicate that specific features, structures, materials or characteristics related to the embodiment(s) or example(s) are included in at least one embodiment or example of the present disclosure. Schematic representation of the above terms does not necessarily refer to the same embodiment(s) or example(s). In addition, the specific features, structures, materials or characteristics may be included in any one or more embodiments or examples in any suitable manner.

Hereinafter, the terms such as “first” and “second” are used for descriptive purposes only, but are not to be construed as indicating or implying the relative importance or implicitly indicating the number of indicated technical features. Thus, the features defined with “first” and “second” may explicitly or implicitly include one or more of the features. In the description of the embodiments of the present disclosure, the term “a plurality of/the plurality of” means two or more unless otherwise specified.

The phrase “at least one of A, B and C” has a same meaning as the phrase “at least one of A, B or C”, and they both include the following combinations of A, B and C: only A, only B, only C, a combination of A and B, a combination of A and C, a combination of B and C, and a combination of A, B and C.

The phrase “A and/or B” includes the following three combinations: only A, only B, and a combination of A and B.

It will be understood that, in a case where a layer or a component is described as being on another layer or a substrate, it may be that the layer or the component is directly on the another layer or the substrate, or that intermediate layer(s) exist between the layer the component and the another layer or the substrate.

The phrase “applicable to” or “configured to” as used herein indicates an open and inclusive expression, which does not exclude devices that are applicable to or configured to perform additional tasks or steps.

Exemplary embodiments are described herein with reference to sectional views and/or plan views as idealized exemplary drawings. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the region in a device, and are not intended to limit the scope of the exemplary embodiments.

Quantum dot light-emitting diode (QLED) display is a novel display technology developed on a basis of organic light-emitting diode (OLED) display. A quantum dot light-emitting layer used in a QLED is a quantum dot layer, and a light-emitting principle thereof is that, holes are injected into the quantum dot layer through a hole transport layer, electrons are injected into the quantum dot layer through an electron transport layer, and the holes combine with the electrons in the quantum dot layer to emit light. Compared with an OLED, the QLED has advantages such as high color saturation, wide color gamut, narrow light-emission peak and good stability.

In a process of manufacturing a quantum dot light-emitting device, as a first approach, a lithography patterning method may be used. The lithography method, which has developed into a mature technology in integrated circuit processing, may provide a reference for a development of the lithography patterning method of quantum dots. Although a traditional lithography method may realize patterning of the quantum dots, there exist bottleneck problems such as complex and tedious process and solvent compatibility, which limits a further application of the method.

As a second approach, a direct patterning method may be used. In the direct patterning method, no photoresist is required, and a process is simple. In related art, when full-color devices are manufactured by patterning quantum dots through the direct patterning method, some additives are usually needed to be added to induce a photosensitization between ligand materials of the quantum dots. That is, due to an action of the additives, cross-linking occurs between the ligand materials of the quantum dots, and quantum dots with a cross-linked structure and low solubility are formed, so that a patterned quantum dot layer is formed. However, the addition of the additives may affect optical properties and electrical properties of the quantum dot layer (i.e., a light-emitting layer).

In light of this, embodiments of the present disclosure provide a quantum dot material. The quantum dot material includes quantum dot bodies and a ligand material coordinated to the quantum dot bodies. The ligand material includes a coordination group and a photosensitive group bound to the coordination group. The photosensitive group is configured to undergo a cycloaddition reaction under light illumination to form a cross-linked ligand. A solubility of the cross-linked ligand in a solvent is less than a solubility of the ligand material in the solvent.

For example, the solvent is a polar solvent such as methylene chloride. Methylene chloride may be used as a developing solution.

That is to say, the coordination group of the ligand material is capable of being bound to the quantum dot bodies of the quantum dot material. Each quantum dot body may be bound with a plurality of coordination groups of the ligand material. For example, quantum dot bodies are bound with coordination groups of the ligand material through coordination bonds, and adjacent photosensitive groups of the ligand material are cross-linked to form a cross-linked ligand under light illumination, such as ultraviolet (UV) light illumination with a wavelength of 365 nm. This kind of ligand materials may be referred to as photosensitive ligands. An existence of the cross-linked ligand enables a plurality of quantum dot bodies to form a network structure, i.e., a cross-linked quantum dot material. The solubility of the cross-linked ligand of the network structure in a solvent is less than the solubility of the ligand material in the solvent. Moreover, the solubility of the cross-linked ligand in the solvent is very low, so that a solubility of the formed cross-linked quantum dot material in the solvent is very low.

Figure 2:
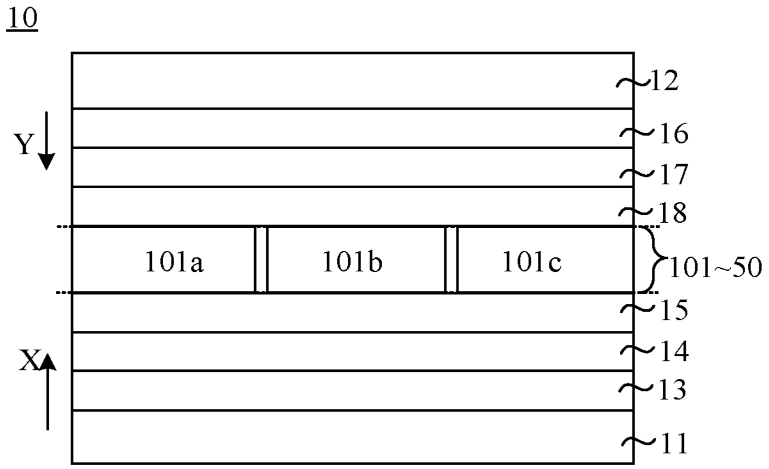
FIG. 2 is a structural diagram of another light-emitting device, in accordance with some embodiments of the present disclosure.
Figure 3:
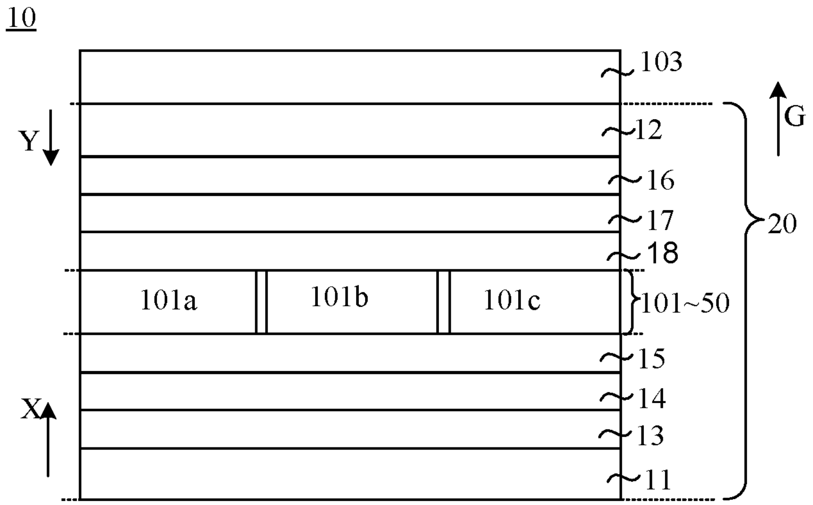
FIG. 3 is a structural diagram of yet another light-emitting device, in accordance with some embodiments of the present disclosure.
Figure 4:
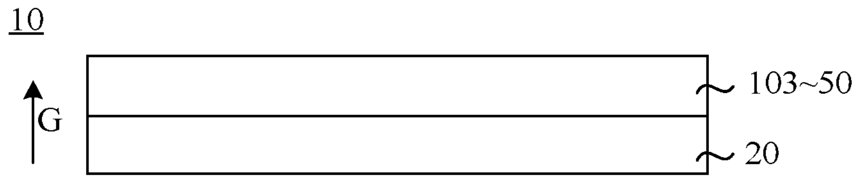
FIG. 4 is a structural diagram of yet another light-emitting device, in accordance with some embodiments of the present disclosure.

Therefore, it may be possible to form a functional layer 50 (the functional layer 50 includes a light-emitting layer 101 as shown in FIGS. 1 to 3, or the functional layer 50 includes a color film layer 103 as shown in FIG. 4, details for which are given below and will not be elaborated here) of a light-emitting 10 as shown in FIGS. 1 to 4 by using the quantum dot material in embodiments of the present disclosure through a direct patterning method, and no additive needs to be added. The quantum dot material in an exposed region (under light illumination) form a cross-linked quantum dot material with low solubility, and then the quantum dot material in the exposed region forms a pattern when development is performed with a developing solution (dichloromethane), so that the functional layer 50 (the functional layer 50 includes the light-emitting layer 101 as shown in FIGS. 1 to 3, or the functional layer 50 includes the color film layer 103 as shown in FIG. 4) of the light-emitting device 10 is directly obtained, which realizes the direct patterning method without photoresist.

Therefore, in a case where the functional layer 50 (the functional layer 50 includes the light-emitting layer 101 as shown in FIGS. 1 to 3, or the functional layer 50 includes the color film layer 103 as shown in FIG. 4) is formed by using the quantum dot material in embodiments of the present disclosure, it may be possible to make manufacture of light-emitting devices 10 simple and efficient and reduce process flows.

A general structural formula of the ligand material is introduced below.

In some embodiments, the ligand material is any one of materials represented by a following general formula (I).

(I)

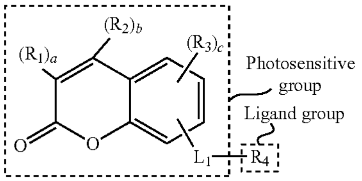

Here, $R_1$, $R_2$ and $R_3$ are same or different, and are each independently any one of fluorine (—F), chlorine (—Cl), bromine (—Br), a methoxyl group (—$OCH_3$) and a cyano group (—CN), $L_1$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$, $R_4$ is any one of a sulfhydryl group (—SH), a carboxyl group (—COOH) and an amino group (—$NH_2$), $R_4$ is a coordination group for being coordinately bound to the quantum dot body. A coordination bond with stable binding force may be formed between the quantum body and any one of the sulfhydryl group (—SH), the carboxyl group (—COOH) and the amino group (—$NH_2$). For specific structures, reference may be made to the following description, which will not be elaborated here.

As shown in the general formula (I), a remaining portion other than the coordinating group $R_4$ is the photosensitive group. A [2+2] cycloaddition reaction occurs between carbon-carbon double bonds of photosensitive groups of adjacent molecules of the ligand material to form a cyclobutane structure. Specific reference may be made to description for a cycloaddition reaction of the ligand material under light illumination below.

Values of a and b are each independently 0 or 1, and a value of c is any one of 0, 1, 2 and 3.

It will be noted that, a carbon chain Cn refers to a carbon chain containing n carbon (C) atoms in total. a, b and c independently represent numbers of respective groups.

Since $L_1$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$, it may be possible to introduce the coordination group to a benzene ring by providing $L_1$. Specific reference may be made to the content below, which will not be elaborated here.

Since $R_1$, $R_2$ and $R_3$ are each independently any one of fluorine (—F), chlorine (—Cl), bromine (—Br), a methoxyl group (—$OCH_3$) and a cyano group (—CN), it may be possible to avoid an esterification reaction or an amidation reaction between the groups of the ligand material during synthesis of the ligand material, which prevents a yield of the ligand material being reduced.

For example, in a case where one or both of $R_1$ and $R_2$ adapt cyano groups (—CN), efficiency of the cycloaddition reaction under light illumination may be improved.

For example, when a takes a value of 1, and $R_1$ is a cyano group (—CN), a structural formula of the ligand material is represented by a following formula.

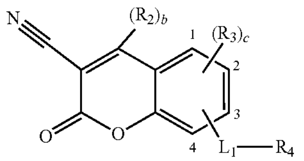

For example, when c takes a value of 0, it indicates that there is no substituent $R_3$ on the phenyl ring. In a case where c takes a value of 1, i.e., there is one substituent $R_3$, the one substituent $R_3$ may be provided on a carbon atom numbered with 1, 2, 3 or 4. In a case where c takes a value of 2, i.e., there are two substituents $R_3$, the two substituents $R_3$ may be provided on any two of carbon atoms numbered with 1, 2, 3 and 4. In a case where c takes a value of 3, i.e., there are three substituents $R_3$, the three substituents $R_3$ may be provided on any three of the carbon atoms numbered with 1, 2, 3 and 4.

It will be noted that, the substituent $L_1$ may be provided on a carbon atom numbered with 1, 2, 3 or 4, and the substituent $R_3$ may be provided on a carbon atom on which no substituent $L_1$ is not provided.

For example, in a case where a, b and c are 0, i.e., no substituent is provided at positions of the ligand material corresponding to $R_1$, $R_2$ and $R_3$, the structural formula is represented by a following formula.

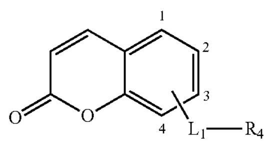

The substituent $L_1$ may be provided on a carbon atom numbered with 1, 2, 3 or 4. For example, the substituent $L_1$ is provided on a carbon atom numbered with 3, and in a case where $L_1$ is an ester bond with a carbon chain having two carbon atoms, and $R_4$ is a sulfhydryl group (—SH), the structural formula may be represented by a following formula $P_{1-1}$.

($P_{1-1}$)

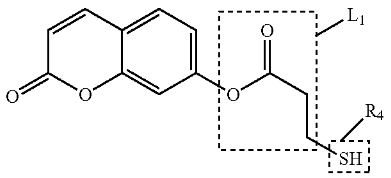

For example, the substituent $L_1$ is provided on the carbon atom numbered with 3, and in a case where $L_1$ is a single bond, and $R_4$ is a carboxyl group (—COOH), the structural formula may be represented by a following formula $P_{1-2}$.

($P_{1-2}$)

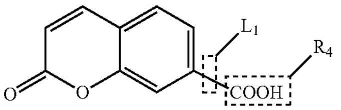

For example, the substituent $L_1$ is provided on the carbon atom numbered with 3, and in a case where $L_1$ is a single bond, and $R_4$ is an amino group (—$NH_2$), the structural formula may be represented by a following formula $P_{1-5}$.

($P_{1-5}$)

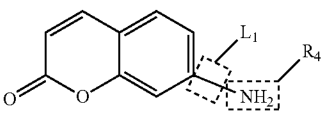

The use of a coumarin derivative shown in the general formula (I) as the ligand material of the quantum dot material in the embodiments of the present disclosure is based on that, coumarin and coumarin derivatives are capable of undergoing a photocycloaddition reaction under ultraviolet (UV) light illumination. A structural formula and a reaction mechanism of the photocycloaddition reaction are shown as follows.

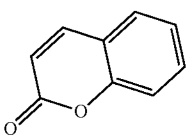

Coumarin

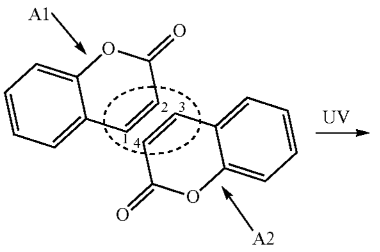

-continued

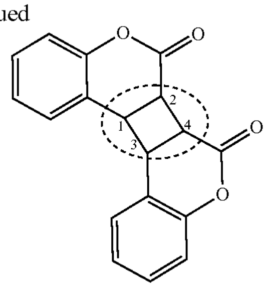

Under ultraviolet (UV) light illumination, a [2+2] cycloaddition reaction occurs between carbon-carbon double bonds of adjacent coumarin molecules to form a cyclobutane structure. That is to say, carbon atoms numbered with "1" and "2" of a first coumarin molecule A1 undergo the [2+2] cycloaddition reaction with carbon atoms numbered with "3" and "4" of a second coumarin molecule A2. Such a process is a process of a photocycloaddition reaction.

Therefore, by synthesizing a suitable coumarin derivative, i.e., by introducing the coordination group on coumarin or a coumarin derivative, the ligand material is enabled to be bound to the quantum dot bodies, so that the ligand material bound to the quantum dot bodies is formed. Then, through ultraviolet (UV) light illumination, a photocycloaddition reaction is enabled to occur between coumarin derivative molecules. Photosensitive groups of coumarin derivatives on adjacent quantum dot bodies undergo the cycloaddition reaction under light illumination to obtain the cross-linked ligand, so that a cross-linked structure is formed between the quantum dot bodies. The quantum dot bodies in such a cross-linked state have low solubility in a developing solution (dichloromethane), which enables the functional layer 50 (the functional layer 50 includes the light-emitting layer 101 as shown in FIGS. 1 to 3, or the functional layer 50 includes the color film layer 103 as shown in FIG. 4) to be formed by a direct patterning method.

In some examples, a method for preparing the ligand material is described by taking a coumarin derivative ligand material represented by the structural formula $P_{1-1}$ as an example. A synthetic route of the coumarin derivative ligand material as shown in the structural formula $P_{1-1}$ is shown in a following formula.

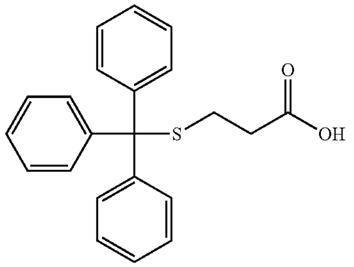

+

3-[(triphenylmethyl)thio]-proionic acid

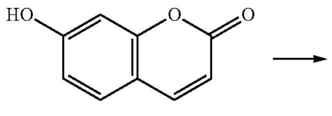

Coumarion derivative

-continued

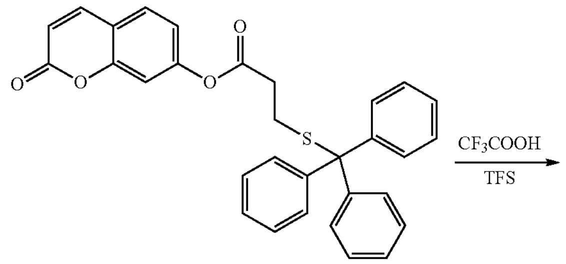

Precursor P1

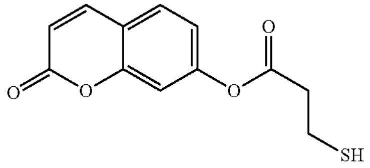

$P_{1-1}$

For example, 3-(tritylthio) propionic acid and a coumarin derivative with a hydroxyl group (—OH) undergo an esterification reaction to obtain a precursor molecule P1 having a coumarin derivative ligand. A triphenylmethylthio group therein is used for protecting a sulfhydryl group (—SH) and preventing the sulfhydryl group (—SH) from participating in the reaction.

Then, trifluoroacetic acid and triethylsilicon (TES) are selected to deprotect the triphenylmethylthio group, where a volume ratio of trifluoroacetic acid to triethylsilicon is 3:1, and a reaction time is about 6 h to 12 h. Finally, the deprotection is completed, and the sulfhydryl group (—SH) is exposed. A deprotection process is monitored by using a silica gel plate, and a content of the generated sulfhydryl group (—SH) in the process is monitored through nuclear magnetic resonance, so that an extent to which the deprotection reaction proceeds is determined. A yield is about 90%.

The synthetic route of the coumarin derivative ligand material as shown in the structural formula P1-1 is as described above. Through the synthetic route, it may be possible to introduce the ligand group, which is used for being bound to the quantum dot body, onto the coumarin derivative ligand material. However, by using different raw materials, a plurality of kinds of coumarin derivative ligand materials may be obtained through such a route.

For example, it may be possible to synthesize a different coumarin derivative ligand material by using a raw material having a structural formula as shown in a following general formula (X) and a raw material having a structural formula as shown in a following general formula (XI) as reactants and through the above synthetic route.

(X)

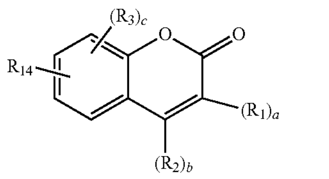

-continued (XI)

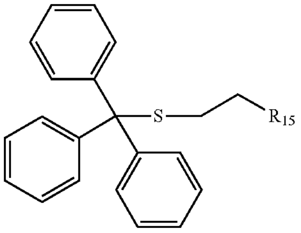

Here, $R_{14}$ is any one of a hydroxyl group (—OH), a carboxyl group (—COOH) or an amino group (—$NH_2$), $R_{15}$ is any one of a carboxyl group (—COOH), a hydroxyl group (—OH) or an amino (—$NH_2$) group, and $R_{14}$ and $R_{15}$ are capable of being bound to each other by an esterification reaction or an amidation reaction. For $R_1$, $R_2$, $R_3$, a, b and c, reference may be made to the description of the general formula (I) above, which will not be repeated here.

It will be noted that, $R_1$, $R_2$ and $R_3$ are same or different, and are each independently any one of fluorine (—F), chlorine (—Cl), bromine (—Br), a methoxyl group (—$OCH_3$) and a cyano group (—CN). Thus, none of a carboxyl group (—COOH), a hydroxyl group (—OH), or an amino group (—$NH_2$) is selected, so that an esterification reaction and an amidation reaction between the groups in the formula (X) may be avoided.

Reaction conditions for esterification or amidation are as follows: adding a dehydration condensation agent to equal amounts of substance of the raw materials represented by the general formulas (X) and (XI), the dehydration condensation agent including 4-dimethylaminopyridine (DMAP) and 1-ethyl-3-(3-dimethylaminopropyl) carbodiimide hydrochloride (EDC), an amount of substance of the dehydration condensation agent being 10% to 30% of an amount of substance of the two raw materials represented by the general formulas (X) and (XI), and a reaction solvent being a polar solvent such as dichloromethane or trichloromethane.

For example, in a case where the values of a, b and c are 0, $R_{14}$ is a hydroxyl group (—OH), and $R_{15}$ is a carboxyl group (—COOH), the coumarin derivative ligand material with the structural formula $P_{1-1}$ is formed through the synthetic route above. For example, in a case where $R_{14}$ is a carboxyl group (—COOH), and $R_{15}$ is a hydroxyl group (—OH), a coumarin derivative ligand material represented by a following structural formula $P_{1-3}$ is formed through the synthetic route above, where the carboxyl group (—COOH) of $R_{14}$ and the hydroxyl group (—OH) of $R_{15}$ form an ester bond in $L_1$.

($P_{1-3}$)

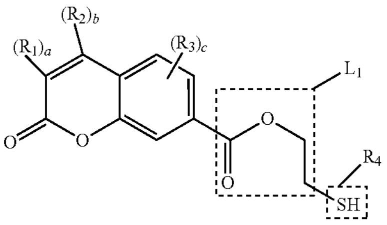

For example, in a case where $R_{14}$ is a carboxyl group (—COOH), and $R_{15}$ is an amino group (—$NH_2$), a coumarin derivative ligand material represented by a following structural formula $P_{1-4}$ is formed through the synthetic route above, where the carboxyl group (—COOH) of $R_{14}$ and the amino group (—$NH_2$) of $R_{15}$ form an amide bond in $L_1$.

($P_{1-4}$)

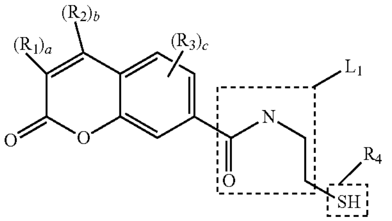

It will be noted that, the above are examples of structures of coumarin derivatives where $R_4$ is a sulfhydryl group (—SH), and do not limit the structures of the coumarin derivatives. These examples use the sulfydryl group (—SH) as the coordination group, because the sulfydryl group (—SH) has strong binding force with the quantum dot body, so that a stable coordination bond may be formed.

Figure 5:
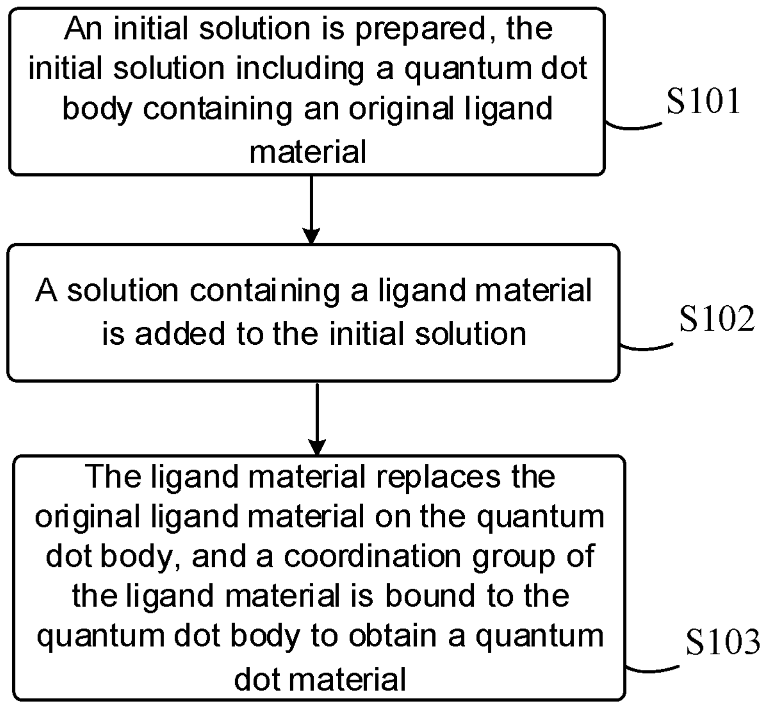
FIG. 5 is a flowchart of a method of ligand exchange, in accordance with some embodiments of the present disclosure.

Formation of quantum dot materials containing the above coumarin derivative ligand materials by a ligand exchange method is described below. As shown in FIG. 5, the ligand exchange method includes steps S101 to S103.

In S101, an initial solution is prepared, the initial solution including the quantum dot body containing an original ligand material.

For example, a solvent of the initial solution is dichloromethane, and the original ligand material is an oleic acid ligand.

In S102, a solution containing the ligand material is added to the initial solution.

For example, the ligand material has the structural formula $P_{1-1}$ above, and a solvent is dichloromethane.

In S103, the ligand material replaces the original ligand material on the quantum dot body, and the coordination group of the ligand material is bound to the quantum dot body to obtain the quantum dot material.

For example, 500 μL of quantum dot octane solution of an oleic acid ligand is measured, the octane solvent therein is evaporated by using a concentrator, and the concentrated composition is dispersed by using 0.5 mL of dichloromethane for use. 60 mg of ligand material was weighed, dissolved by using 1 mL of dichloromethane and transferred to the initial solution. Magnetic stirring is performed for 4 h. In this process, the ligand material having the structural formula $P_{1-1}$ replaces the oleic acid ligand bound to a quantum dot to form the quantum dot material where the ligand material represented by the structural formula $P_{1-1}$ is bound to the quantum dot body. The ligand exchange process is as shown in a following formula.

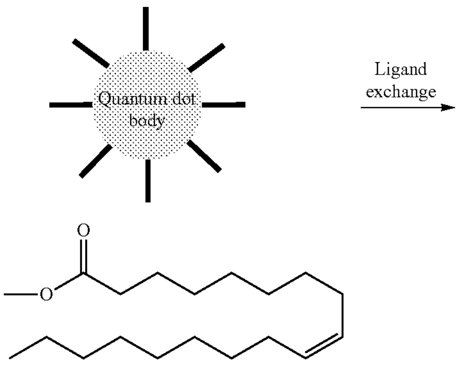

(Oleic acid)

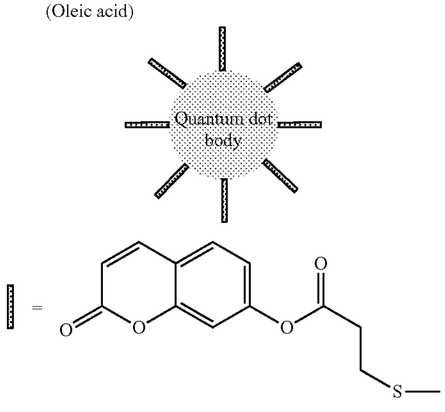

($P'_{1-1}$)

It will be noted that, since a binding force between the coumarin derivative ligand material and the quantum dot body is stronger than a binding force between the oleic acid ligand and the quantum dot body, the coumarin derivative ligand material can replace the original oleic acid ligand on the quantum dot body. In this process, each quantum dot body is bound with a plurality of coordination groups of the coumarin derivative ligand material.

In formed quantum dot material, a mass ratio of the ligand material to the quantum dot bodies is in a range of 1:10 to 3:20, inclusive. For example, the ligand material is a coumarin derivative, and the mass ratio of the ligand material to the quantum dot bodies is 1:10, 1:8 or 3:20. The mass ratio is not limited thereto.

By setting the mass ratio of the ligand material to the quantum dot bodies to be in the range of 1:10 to 3:20, inclusive, it may be possible to meet requirements that original ligand material (such as oleic acid ligands) is fully replaced by the ligand material (such as a coumarin derivative), and the cross-linked ligand with sufficiently low solubility is formed after light illumination, which prevents the cross-linked quantum dot from being dissolved in a polar solvent.

As can be seen from the ligand exchange process above, the coumarin derivative ligand material represented by the structural formula $P_{1-1}$ is bound to the quantum dot body through a coordination bond. That is, the quantum dot body replaces a hydrogen atom in a sulfydryl group (—SH) to form the coordination bond with a sulfur atom therein, which realizes connection between the coumarin derivative ligand material and the quantum dot body. A structural formula obtained by removing the hydrogen atom from the sulfhydryl group (—SH) of the coumarin derivative represented by the structural formula $P_{1-1}$ is represented as P'1-1.

For example, in a case where the coumarin derivative ligand material is represented by the structural formula $P_{1-2}$, a structure formed by binding the coumarin derivative ligand material to the quantum dot body through a coordination bond is as shown in a following formula.

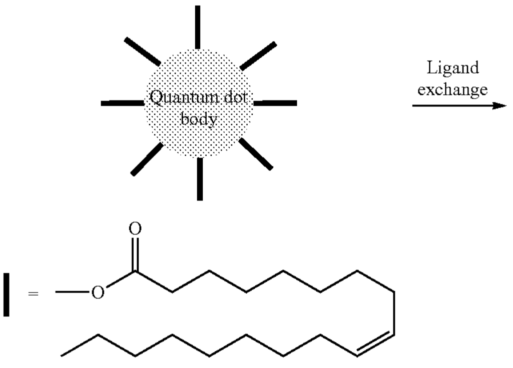

(Oleic acid)

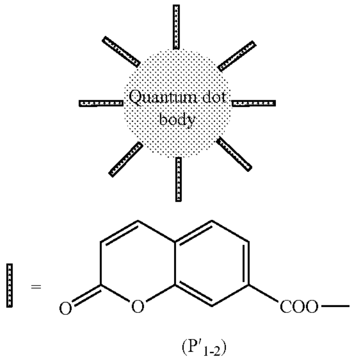

($P'_{1-2}$)

That is to say, the quantum dot body replaces a hydrogen atom in a carboxyl group (—COOH) to form a coordination bond with an oxygen atom therein, so that the coumarin derivative ligand material is bound to the quantum dot body. A structural formula obtained by removing the hydrogen atom from the carboxyl group (—COOH) of the coumarin derivative represented by the structural formula $P_{1-2}$ is represented as P'1-2.

For example, in a case where the coumarin derivative ligand material is represented by the structural formula $P_{1-5}$, a structure formed by binding the coumarin derivative ligand material to the quantum dot body through a coordination bond is as shown in a following formula.

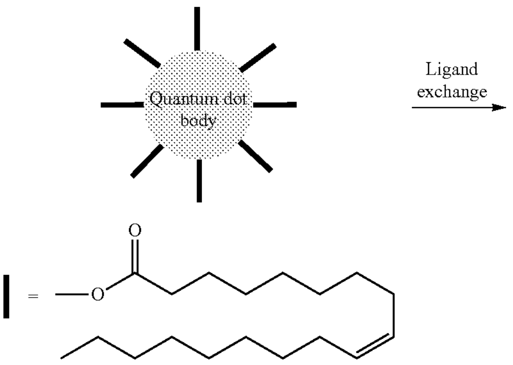

(Oleic acid)

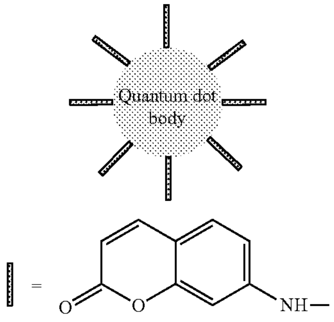

($P'_{1-5}$)

That is to say, the quantum dot body replaces a hydrogen atom in an amino group (—$NH_2$) to form a coordination bond with a nitrogen atom therein, so that the coumarin derivative ligand material is bound to the quantum dot body. A structural formula obtained by removing the hydrogen atom from the amino group (—$NH_2$) of the coumarin derivative represented by the structural formula $P_{1-5}$ is represented as P'1-5.

A structure of the cross-linked ligand formed by a cycloaddition reaction of the ligand material represented by the general formula (I) under light illumination is described below.

In some examples, photosensitive groups of the ligand material represented by general formula (I) undergo a cycloaddition reaction under light illumination to form the cross-linked ligand. The cross-linked ligand may be any one of cross-linked ligands represented by a following general formula (II).

(II)

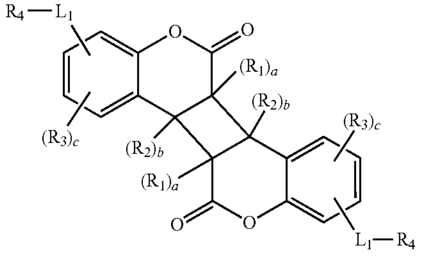

For $R_1$, $R_2$, $R_3$, $R_4$, $L_1$, a, b and c, reference may be made to the description of the general formula (I) above, which will not be repeated here.

A structure formed by the cross-linked ligand represented by the general formula (II) and quantum dot bodies is any one of structures represented by a following general formula (VII).

(VII)

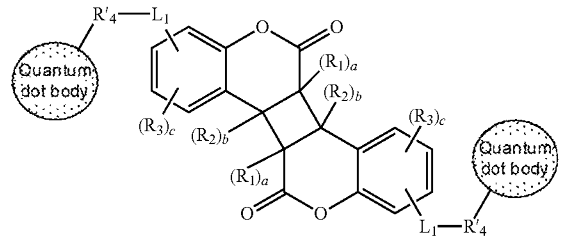

It will be noted that, in order to more clearly show a process of a photocycloaddition reaction of the coumarin derivative ligand material, each quantum dot body in the general formula (VII) is coordinately bound with one coumarin derivative molecule. It will be understood that, each quantum dot body is coordinately bound with a plurality of coumarin derivative molecules, and a cross-linked quantum dot material is formed through a photocycloaddition reaction of the coumarin derivative ligand material.

For example, considering the ligand material represented by the structural formula $P_{1-1}$ as an example, in a process of forming the functional layer 50 (the functional layer 50 includes the light-emitting layer 101 as shown in FIGS. 1 to 3, or the functional layer 50 includes the color film layer 103 as shown in FIG. 4) by a direct patterning method, a process of patterning the quantum dot material is as shown in a following formula.

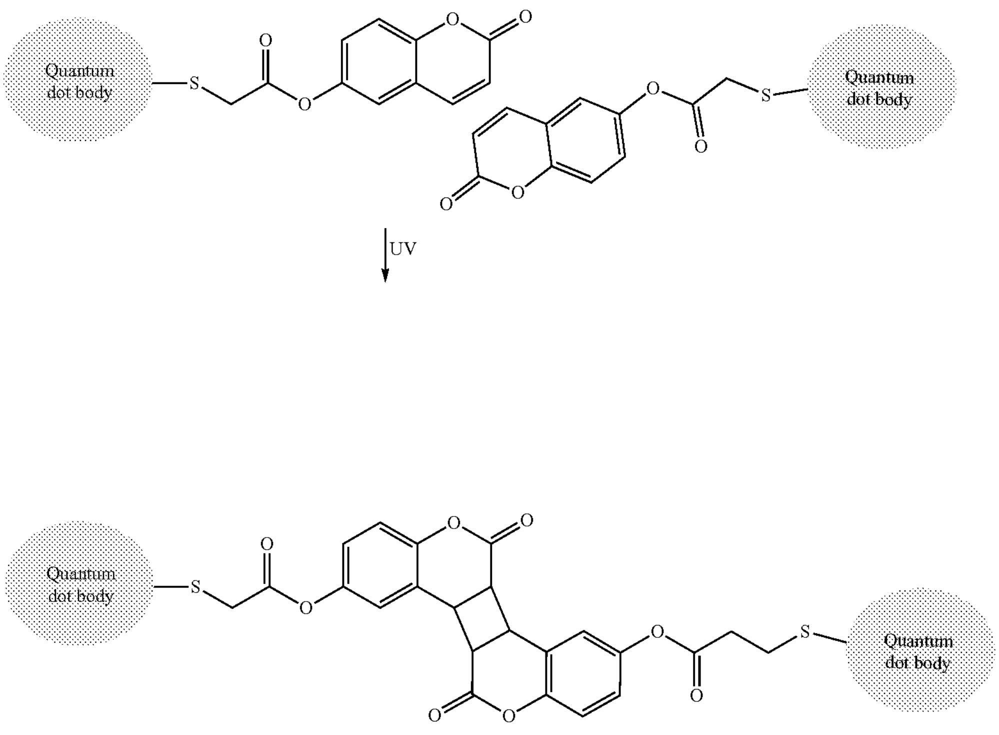

Here, $R'_4$ is a group formed by coordination connection between the coordination group $R_4$ and the quantum dot body, $R_4$ is any one of a sulfhydryl group (—SH), a carboxyl group (—COOH) and an amino group (—$NH_2$), $R'_4$ corresponds to $R_4$, and $R'_4$ is any one of structures formed by removal of a hydrogen atom from the sulfhydryl group (—SH), the carboxyl group (—COOH) and the amino group (—$NH_2$).

For example, $R_4$ is —SH, and $R'_4$ is —S—; or $R_4$ is —COOH, and $R'_4$ is —COO—; or $R_4$ is —$NH_2$, and $R'_4$ is —NH—.

That is to say, under ultraviolet (UV) light illumination, a [2+2] cycloaddition reaction occurs between carbon-carbon double bonds of photosensitive groups of adjacent molecules of the coumarin derivative ligand material to form a cyclobutane structure, so that the cross-linked ligand with low solubility in dichloromethane is obtained.

For example, a quantum dot solution of the coumarin derivative ligand material is coated into a film, placed under a mask for exposure by 365 nm ultraviolet (UV) light, immersed in a dichloromethane solution for elution and development, and dried to obtain a patterned functional layer 50 (the functional layer 50 includes the light-emitting layer 101 as shown in FIGS. 1 to 3, or the functional layer 50 includes the color film layer 103 as shown in FIG. 4).

In an exposed region, a [2+2] cycloaddition reaction occurs between photosensitive groups of the coumarin derivative ligand material. Since a surface of a quantum dot body contains a large number of photosensitive groups of the coumarin derivative ligand material, and all photosensitive groups undergo a [2+2] photocycloaddition reaction, quantum dot bodies in the exposed region are cross-linked, which enable a solubility of the quantum dot bodies in a developing solution (such as a dichloromethane solvent) to be reduced. The ligand material in a non-exposed region is unchanged, and no cross-linked ligand is formed. When the developing solution is used for development, the developing solution can wash away the quantum dot material in the non-exposed region, and a cross-linked quantum dot material in the exposed region can be reserved to form a quantum dot pattern consistent with the mask.

In embodiments of the present disclosure, by introducing the ligand material containing photosensitive ligands onto the quantum bodies, for example, by using a coumarin derivative as the ligand material of the quantum dot material, in a process of forming the functional layer 50 (the functional layer 50 includes the light-emitting layer 101 as shown in FIGS. 1 to 3, or the functional layer 50 includes the color film layer 103 as shown in FIG. 4) by using the quantum material, a photocycloaddition reaction occurs between the photosensitive groups of the ligand material under light illumination, so that the ligand material are cross-linked to realize crosslinking of the quantum dot bodies, and the cross-linked quantum dot material with the network structure is formed. Such a formation process is simple and efficient, and process flows are reduced. In addition, no additive is required to be added, which prevents an additive affecting electrical properties and optical properties of quantum dots and light-emitting efficiency of the light-emitting device 10.

Another general structural formula of the ligand material is described below.

In some embodiments, the ligand material is selected from any one of materials represented by a following general formula (III).

(III)

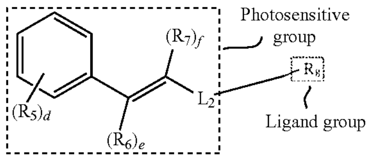

Here, $R_5$ is any one of fluorine (—F), chlorine (—Cl), bromine (—Br), a methoxyl group (—$OCH_3$) and a cyano group (—CN), $R_6$ and $R_7$ are same or different, and at least one of $R_6$ and $R_7$ is a cyano group (—CN), $L_2$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$, $R_8$ is any one of a sulfhydryl group (—SH), a carboxyl group (—COOH) and an amino group (—$NH_2$), and $R_8$ is a coordination group for being coordinately bound to the quantum dot body, the sulfhydryl group (—SH), the carboxyl group (—COOH) or the amino group (—$NH_2$) being capable of forming a coordination bond with stable binding force with the quantum dot body.

As shown in the general formula (III), a portion other than the coordination group $R_8$ is the photosensitive group, and a [2+2] cycloaddition reaction occurs between carbon-carbon double bonds of photosensitive groups of adjacent ligand material molecules to form a cyclobutane structure.

A value of d is any one of 0, 1, 2, 3, 4 and 5, and values of e and f are each independently 0 or 1. Similarly, a carbon chain Cn refers to a carbon chain containing n carbon (C) atoms in total. d, e and f each independently represent numbers of respective groups.

Since $L_2$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$, it may be possible to introduce the coordination group to a benzene ring by providing $L_2$.

Since $R_5$ is any one of fluorine (—F), chlorine (—Cl), bromine (—Br), a methoxyl group (—$OCH_3$) and a cyano group (—CN), it may be possible to avoid an esterification reaction or an amidation reaction between the groups of the ligand material during synthesis of the ligand material, which prevents a yield of the ligand material being reduced. $R_6$ and $R_7$ are the same or different, and at least one of $R_6$ and $R_7$ is a cyano group (—CN). In a case where the substituent of $R_6$ and/or the substituent of $R_7$ is a cyano group (—CN), efficiency of the cycloaddition reaction under light illumination may be improved.

For types and numbers of the substituents, reference may be made to the description of the ligand material with the general formula (I), and examples will not be repeated here.

It will be noted here, in the general formula (III), a vinyl group double bond of a styrene derivative is used as a reactive group of the photosensitive group for performing a photocycloaddition reaction to form the cross-linked ligand.

For example, in a case where values of d, e and f are 0, $L_2$ is a single bond, and $R_8$ is a carboxyl group (—COOH), a structural formula of the ligand material is represented as $P_{2-1}$ below.

($P_{2-1}$)

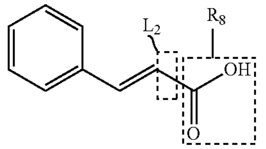

For example, in a case where values of d, e and f are 0, $L_2$ is an ester bond with a carbon chain having two carbon atoms, and $R_8$ is the sulfhydryl group (—SH), the structural formula of the ligand material may be represented as $P_{2-2}$ below.

($P_{2-2}$)

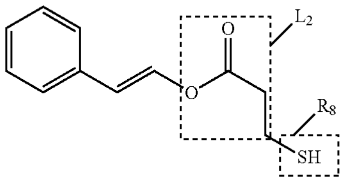

It will be noted that, the ligand materials shown in the above structural formulas $P_{2-1}$ and $P_{2-2}$ are examples of structures where a styrene derivative is used as the ligand material, and the structures where a styrene derivative is used as the ligand material are not limited thereto.

The use of a styrene derivative represented by the general formula (III) as the ligand material of the quantum dot material in the embodiments of the present disclosure is based on that, styrene and derivatives thereof are capable of undergoing a photocycloaddition reaction under ultraviolet (UV) light illumination. A reaction mechanism of the photocycloaddition reaction of the styrene derivatives is as follows.

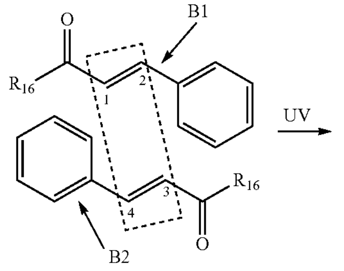

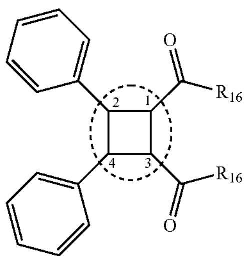

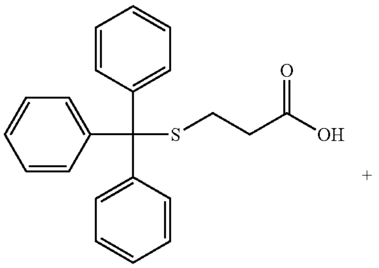

3-(triphenylmethylthio) proionic acid

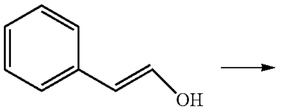

Styrene derivative

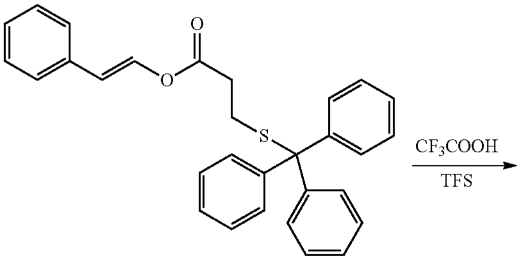

Precursor P2

Under ultraviolet (UV) light illumination, a [2+2] cyclization addition reaction occurs between carbon-carbon double bonds of adjacent styrene derivative molecules to form a cyclobutane structure. That is to say, carbon atoms numbered with “1” and “2” of a first styrene derivative B1 undergo a [2+2] cycloaddition reaction with carbon atoms numbered with “3” and “4” of a second styrene derivative B2. Such a process is a process of a photocycloaddition reaction.

It will be noted that, in the above description of the reaction mechanism of the photocycloaddition reaction of the styrene derivatives, the substituent $R_{16}$ in the styrene derivatives is not specifically limited.

Therefore, it may be possible to introduce a coordination group to styrene and the derivatives thereof to synthesize a styrene derivative ligand material bound to the quantum dot bodies, and then a photocycloaddition reaction is performed between styrene derivative molecules under ultraviolet (UV) light illumination. Photosensitive groups of the ligand material formed by the styrene derivative bound to the quantum dot bodies are capable of undergoing a photocycloaddition reaction to obtain the cross-linked ligand, so that a cross-linked structure is formed between the quantum dot bodies. A solubility of the quantum dot bodies with the cross-linked structure in a developing solution (dichloromethane) is very low.

In some examples, a method for preparing the ligand material is described by considering an example where the styrene derivative represented by the structural formula of $P_{2-2}$ serves as the ligand material. A synthetic route of a styrene derivative ligand material represented by the structural formula of $P_{2-2}$ is shown as follows.

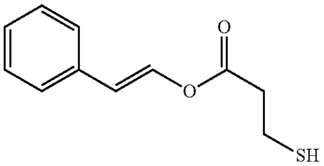

($P_{2-2}$)

For example, a precursor $P_2$ containing a styrene derivative ligand is obtained through esterification of 3-(tritylthio) propionic acid with a styrene derivative having a hydroxyl group (—OH). Similarly, a phenylmethylthio group is used for protecting a sulfhydryl group (—SH).

Then, trifluoroacetic acid and triethylsilicon (TES) are selected to deprotect the triphenylmethylthio group. Reference may be made to the above description of the synthetic route of the coumarin derivative ligand material represented by the structural formula $P_{1-1}$ for details, which will not be repeated here.

The synthetic route for synthesizing the styrene derivative ligand material represented by the structural formula $P_{2-2}$ is described above. However, by using different raw materials, a plurality of kinds of styrene derivative ligand materials may be obtained through such a route.

For example, it may be possible to use a raw material represented by a following structural formula (XII-1) and a raw material represented by the structural formula (XI) as reactants to synthesize a different styrene derivative ligand material through the above synthetic route.

(XII-1)

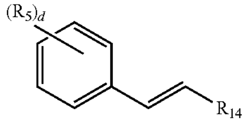

(XI)

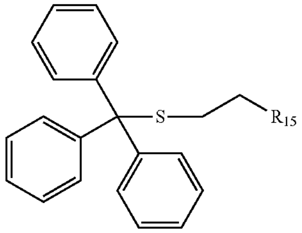

Here, $R_{14}$ is any one of a hydroxyl group (—OH), a carboxyl group (—COOH) or an amino group (—$NH_2$), $R_{15}$ is any one of a carboxyl group (—COOH), a hydroxyl group (—OH) or an amino (—$NH_2$) group, and $R_{14}$ and $R_{15}$ are capable of being bound to each other by an esterification reaction or an amidation reaction. For values of $R_5$ and d, reference may be made to the description of the structural formula (III) above, which will not be repeated here.

It will be noted that, $R_5$ is any one of fluorine (—F), chlorine (—Cl), bromine (—Br), a methoxyl group (—$OCH_3$) and a cyano group (—CN), which means that none of a carboxyl group (—COOH), a hydroxyl group (—OH), or an amino group (—$NH_2$) is selected. Thus, an esterification reaction and an amidation reaction between groups in the general formula (XII-1) may be avoided.

For reaction conditions of esterification and amidation, reference may be made to the description of the synthesis of the coumarin derivative ligand material above, which will not be repeated here.

For example, in a case where $R_{14}$ is a hydroxyl group (—OH), and $R_{15}$ is a carboxyl group (—COOH), the styrene derivative ligand material represented by the structural formula $P_{2-2}$ is formed through the above synthetic route.

For example, in a case where $R_{14}$ is a carboxyl group (—COOH), and $R_{15}$ is an amino group (—$NH_2$), a styrene derivative ligand material represented by a following structural formula $P_{2-3}$ is formed through the above synthetic route, where the carboxyl group (—COOH) of $R_{14}$ and the amino group (—$NH_2$) of $R_{15}$ form an amide bond in $L_2$.

($P_{2-3}$)

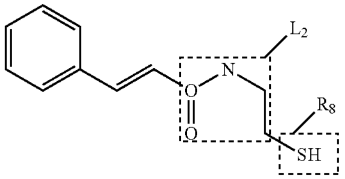

It will be noted that, the above are examples of structures of styrene derivatives where $R_8$ is a sulfhydryl group (—SH), and the structures of the styrene derivatives are not limited thereto. The examples use a sulfydryl group (—SH) as the coordination group, because the sulfydryl group (—SH) has strong binding force with the quantum dot body, which may enable formation of a stable coordination bond.

In some examples, similarly, quantum dot materials containing the styrene derivative ligand materials above are formed by a ligand exchange method. For steps of forming the quantum dot materials containing the styrene derivative ligand materials by using the ligand exchange method, reference may be made to the above steps S101 to S103, which will not be repeated here.

It will be noted that, a raw material represented by the general formula (XII-1) is also a styrene derivative, and the raw material represented by the general formula (XII-1) is a same material as the ligand material represented by $P_{2-1}$ in a case where the substituent $R_{14}$ is a carboxyl group (—COOH). In this case, it may be possible to directly coordinate the raw material represented by the structural formula $P_{2-1}$ with the quantum dot bodies to form the quantum dot material represented by a following structural formula.

($P'_{2-1}$)

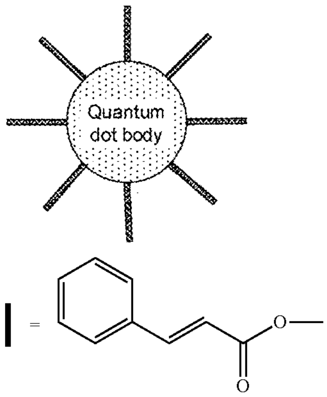

That is to say, the quantum dot body replaces a hydrogen atom of a carboxyl group (—COOH) to form a coordination bond with an oxygen atom therein, so that the styrene derivative ligand material is bound to the quantum dot bodies. A structural formula obtained after the hydrogen atom is removed from the carboxyl group (—COOH) of the styrene derivative represented by the structural formula $P_{2-1}$ is represented as $P'_2$-1.

In some examples, in a case where the substituent $R_{14}$ is a carboxyl group (—COOH), a sulfhydryl group (—SH) may be introduced as the coordination group. A styrene derivative ligand material is formed after sulfhydryl groups (—SH) are introduced. The ligand material coordinates with the quantum dot bodies to form a quantum dot material represented by a following structural formula.

(P'2-3)

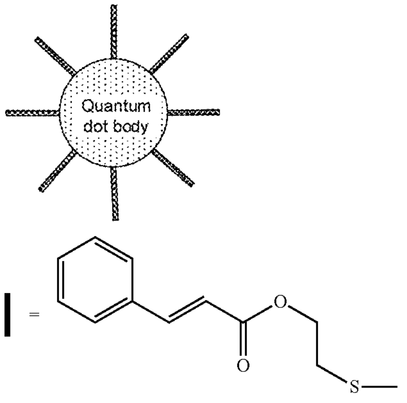

That is to say, the quantum dot body replaces a hydrogen atom of the sulfydryl group (—SH) to form a coordination bond with a sulfur atom, so that the styrene derivative ligand material is bound to the quantum dot bodies. A structural formula obtained after the hydrogen atom is removed from the sulfhydryl group (—SH) of the ligand material is represented by P'$_2$-3.

A structure of a cross-linked ligand formed by a cycloaddition reaction of the ligand material represented by the general formula (III) under light illumination is described below.

In some examples, a cycloaddition reaction occurs between photosensitive groups of the ligand material represented by the general formula (III) under light illumination, and the formed cross-linked ligand is any one of cross-linked ligands represented by a following general formula (IV).

(IV)

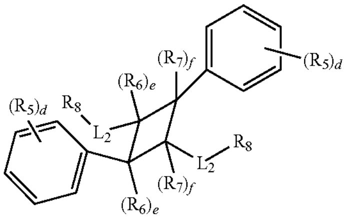

For $R_5$, $R_6$, $R_7$, $R_8$, $L_2$, d, e and f, reference may be made to the description of the general formula (III), which will not be repeated here.

A structure formed by the cross-linked ligand represented by the general formula (IV) and the quantum dot bodies is any one of structures represented by a following general formula (VIII).

(VIII)

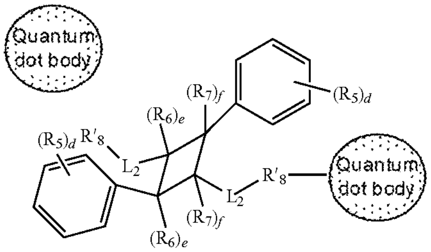

Here, $R'_8$ is a group formed be coordination connection between the coordination group $R_8$ and the quantum dot body; $R_8$ is any one of a sulfydryl group (—SH), a carboxyl group (—COOH) and an amino group (—$NH_2$), and $R'_8$ is any one of structures obtained by removal of a hydrogen atom from the sulfydryl group (—SH), the carboxyl group (—COOH) and the amino group (—$NH_2$).

For example, $R_8$ is —SH, and $R'_8$ is —S—; or $R_8$ is —COOH, and $R'_8$ is —COO—; or $R_8$ is —$NH_2$, and $R'_8$ is —NH—.

That is to say, under ultraviolet (UV) light illumination, a [2+2] cycloaddition reaction occurs between carbon-carbon double bonds of photosensitive groups of adjacent molecules of styrene derivative ligand material to form a cyclobutane structure, so that a cross-linked ligand with low solubility in dichloromethane is obtained. It will be noted that, in order to more clearly show a process of the photo-cycloaddition reaction of the styrene derivative ligand material, each quantum dot body in the general formula (VIII) is coordinately bound with one styrene derivative molecule. It will be understood that, each quantum dot body is coordinately bound with a plurality of styrene derivative molecules, and a cross-linked quantum dot material is formed through a photocycloaddition reaction of the styrene derivative ligand material.

For example, considering the ligand material represented by the structural formula $P_{2-1}$ as an example, during a process of forming the functional layer 50 (the functional layer 50 includes the light-emitting layer 101 shown in FIGS. 1 to 3; or the functional layer 50 includes the color film layer 103 shown in FIG. 4) by patterning, the patterning process of the quantum dot material is as shown in a following formula.

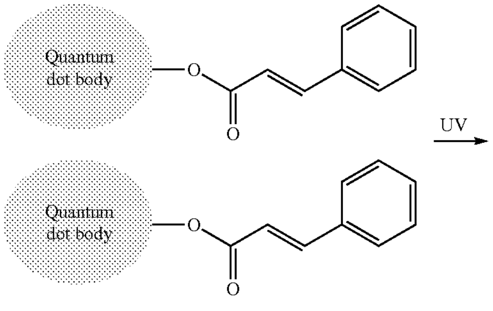

-continued

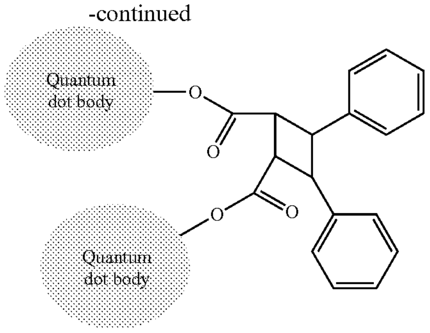

For example, a quantum dot solution of the styrene derivative ligand material is coated into a film, placed under a mask for exposure by 365 nm ultraviolet (UV) light, immersed in a dichloromethane solution for elution and development, and dried to obtain a patterned functional layer 50 (the functional layer 50 includes the light-emitting layer 101 as shown in FIGS. 1 to 3, or the functional layer 50 includes the color film layer 103 as shown in FIG. 4).

In an exposed region, a [2+2] cycloaddition reaction occurs between photosensitive groups of the styrene derivative ligand material. As a surface of the quantum dot body contains a plurality of photosensitive groups of the styrene derivative ligand material, and all photosensitive groups undergo a [2+2] photocycloaddition reaction, cross-linking occurs between quantum dot bodies in the exposed region, which enables a solubility of the quantum dot bodies in a developing solution (such as a dichloromethane solvent) to be reduced. The ligand material in a non-exposed region is unchanged, and no cross-linked ligand is formed. When the developing solution is used for development, the developing solution can wash away the quantum dot material in the non-exposed region, and the cross-linked quantum dot material in the exposed region can be reserved to form a quantum dot pattern consistent with the mask.

Yet another general structural formula of the ligand material is described below.

In some embodiments, the ligand material is any one of materials represented by a following general formula (V).

(V)

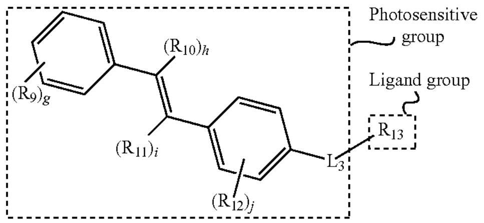

Here, $R_9$ and $R_{12}$ are same or different, and are each independently any one of fluorine (—F), chlorine (—Cl), bromine (—Br), a methoxyl group (—$OCH_3$) and a cyano group (—CN), $R_{10}$ and $R_{11}$ are same or different, and at least one of $R_{10}$ and $R_{11}$ is a cyano group (—CN), $L_3$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$, $R_{13}$ is any one of a sulfydryl group (—SH), a carboxyl group (—COOH) and an amino group (—$NH_2$), and $R_{13}$ is a coordination group for being coordinately bound to the quantum dot body, the sulfhydryl group (—SH), the carboxyl group (—COOH) or the amino group (—$NH_2$) being capable of forming a coordination bond with stable binding force with the quantum dot body.

As shown in the above general formula (V), a portion other than the coordination group $R_{13}$ is the photosensitive group, and a [2+2] cycloaddition reaction occurs between carbon-carbon double bonds of photosensitive groups of adjacent molecules of the ligand material to form a cyclobutane structure. Reference may be made to the following description of the cycloaddition reaction of the ligand material under light illumination.

A value of g is any one of 0, 1, 2, 3, 4 and 5, a value of j is any one of 0, 1, 2, 3 and 4, and values of h and i are independently 0 or 1. Similarly, a carbon chain Cn refers to a carbon chain containing n carbon (C) atoms in total. g, h, i and g each independently represents numbers of respective groups.

Since $L_3$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$, it may be possible to introduce the coordination group to a benzene ring by providing $L_3$.

Since $R_9$ and $R_{12}$ are each independently any one of fluorine (—F), chlorine (—Cl), bromine (—Br), a methoxyl group (—$OCH_3$) and a cyano group (—CN), it may be possible to avoid an esterification reaction or an amidation reaction between the groups of the ligand material during synthesis of the ligand material, which prevents a yield of the ligand material being reduced.

Since $R_{10}$ and $R_{11}$ are the same or different, and at least one of $R_{10}$ and $R_{11}$ is a cyano group (—CN), efficiency of the photocycloaddition reaction may be improved in a case the substituent of $R_{10}$ and/or the substituent $R_{11}$ are cyano groups (—CN).

For types and numbers of the substituents, reference may be made to the description of the ligand material with the general formula (I), and examples will not be repeated here.

It will be noted that, in the general formula (V), a vinyl group double bond of a stilbene derivative is used as a reactive group of the photosensitive group for performing a photocycloaddition reaction to form a cross-linked ligand.

For example, in a case where a value of i is 0, values of g, h and j are 1, $R_9$ is fluorine (—F), $R_{10}$ is a cyano group (—CN), $R_{12}$ is bromine (—Br), $L_3$ is a single bond, and $R_{13}$ is a carboxyl group (—COOH), a structural formula of the ligand material is represented as $P_{3-1}$ below.

($P_{3-1}$)

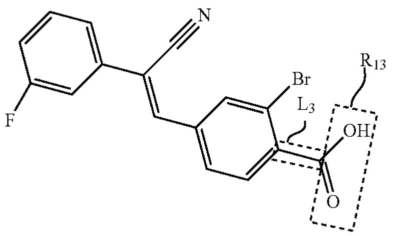

For example, in a case where values of g, i and j are 0, a value of h is 1, $R_{10}$ is a cyano group (—CN), $L_3$ is a single bond, and $R_{13}$ is a carboxyl group (—COOH), a structural formula of the ligand material is represented as $P_{3-2}$ below.

(P3-2)

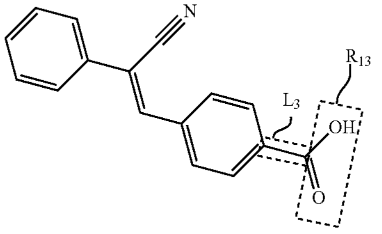

For example, in a case where values of g, h and j are 0, a value of i is 1, $R_{11}$ is a cyano group (—CN), $L_3$ is an ester bond with a carbon chain having two carbon atoms, and $R_{13}$ is a sulfhydryl group (—SH), a structural formula may be as in $P_{3-3}$ below.

(P3-3)

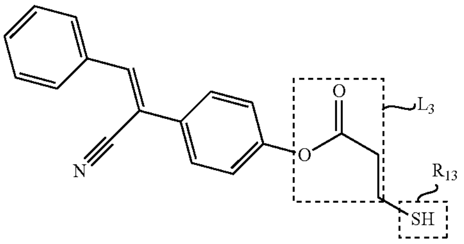

It will be noted that, the ligand materials shown in the above structural formulas $P_{3-1}$, $P_{3-2}$ and $P_{3-3}$ are examples of structures of stilbene derivatives as the ligand material, and the structures of the stilbene derivatives as the ligand material are not limited thereto.

The use of a stilbene derivative represented by the general formula (V) as the ligand material of the quantum dot material in the embodiments of the present disclosure is stilbene based on that, stilbene and derivatives thereof are capable of undergoing a photocycloaddition reaction under ultraviolet (UV) light illumination. A reaction mechanism of the photocycloaddition reaction of the stilbene derivatives is as follows.

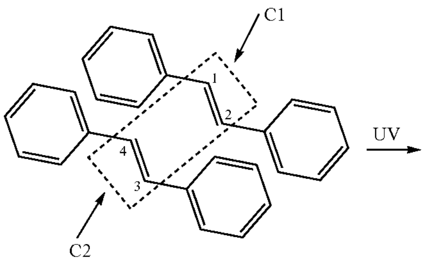

Stilbene

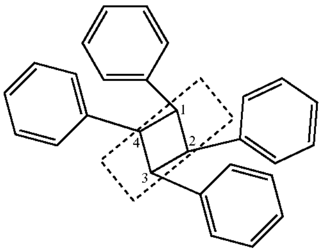

Under ultraviolet (UV) light illumination, a [2+2] cycloaddition reaction occurs between carbon-carbon double bonds of adjacent stilbene molecules to form a cyclobutane structure. That is to say, carbon atoms numbered with "1" and "2" of a first stilbene undergo a [2+2] cycloaddition reaction with carbon atoms numbered with "3" and "4" of a second stilbene. Such a process is a process of a photocycloaddition reaction.

Therefore, it may be possible to introduce the coordination group to stilbene and the derivatives thereof to synthesize a stilbene derivative ligand material bound to the quantum dot bodies. Then, a photocycloaddition reaction is performed between stilbene derivative molecules under ultraviolet (UV) light illumination. Photosensitive groups of the ligand material formed by stilbene derivatives and bound to the quantum dot bodies are capable of undergoing a photocycloaddition reaction to obtain a cross-linked ligand, so that a cross-linked structure is formed between the quantum dot bodies. A solubility of the quantum dot bodies with the cross-linked structure in a developing solution (dichloromethane) is very low.

In some examples, a method for preparing the ligand material is described by considering an example where the stilbene derivative represented by the structural formula of $P_{3-3}$ serves as the ligand material. A synthetic route of a stilbene derivative ligand material represented by the structural formula of $P_{3-3}$ is shown as follows.

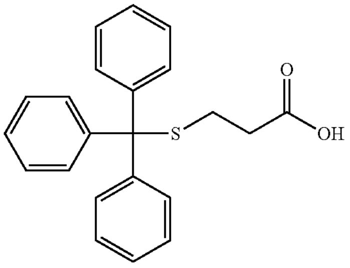

+

3-(triphenylmethylthio)-proionic acid

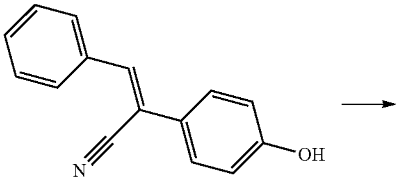

Stilbene derivative

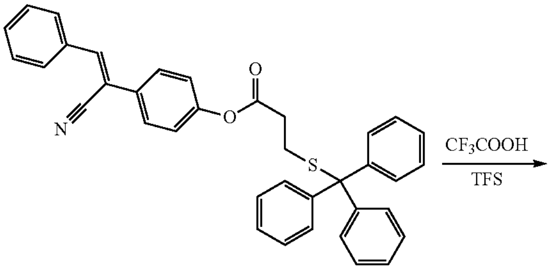

Precursor P3

-continued

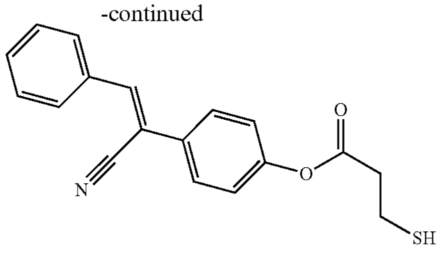

($P_{3-3}$)

For example, a precursor $P_3$ containing a stilbene derivative ligand is obtained by esterification of 3-(tritylthio) propionic acid with a stilbene derivative having a hydroxyl group (—OH). Similarly, a phenylmethylthio group is used for protecting the sulfhydryl group (—SH).

Then, trifluoroacetic acid and triethylsilicon (TES) are selected to deprotect the triphenylmethylthio group. Reference may be made to the above description of the synthetic route of the coumarin derivative ligand material with the structural formula $P_{1-1}$ for details, which will not be repeated here.

The synthetic route for forming the stilbene derivative ligand material represented by the structural formula $P_{3-3}$ is described above. However, by using different raw materials, a plurality of kinds of stilbene derivative ligand materials may be obtained through such a route.

For example, it may be possible to use a raw material represented by a following structural formula (XII-2) and a raw material with the structural formula (XI) as reactants to synthesize a different stilbene derivative ligand material through the above synthetic route.

(XII-2)

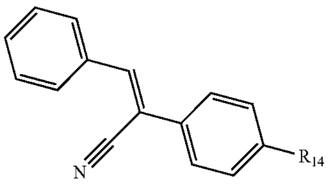

(XI)

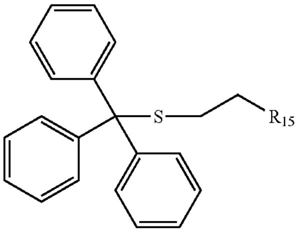

Here, $R_{14}$ is any one of a hydroxyl group (—OH), a carboxyl group (—COOH) or an amino group (—$NH_2$), $R_{15}$ is any one of a carboxyl group (—COOH), a hydroxyl group (—OH) and an amino (—$NH_2$) group, and $R_{14}$ and $R_{15}$ are capable of being bound to each other by an esterification reaction or an amidation reaction.

It will be noted that, by providing a cyano group (—CN) on a carbon atom of a vinyl double bond of stilbene, efficiency of the photocycloaddition reaction may be improved.

For reaction conditions of esterification and amidation, reference may be made to the description of the synthesis of the coumarin derivative ligand material above, which will not be repeated here.

For example, in a case where $R_{14}$ is a hydroxyl group (—OH), and $R_{15}$ is a carboxyl group (—COOH), a stilbene derivative ligand material with a structural formula $P_{3-3}$ is formed through the above synthetic route.

For example, in a case where $R_{14}$ is a carboxyl group (—COOH), and $R_{15}$ is a hydroxyl group (—OH), a stilbene derivative ligand material represented by a structural formula $P_{3-4}$ is formed through the above synthetic route, where the carboxyl group (—COOH) of $R_{14}$ and the hydroxyl group (—OH) of $R_{15}$ form an ester bond in $L_3$.

($P_{3-4}$)

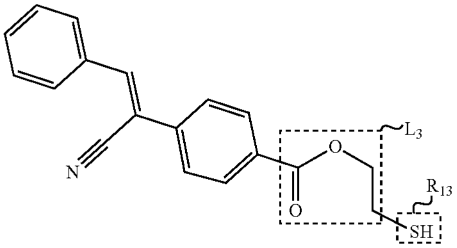

For example, in a case where $R_{14}$ is a carboxyl group (—COOH), and $R_{15}$ is an amino group (—$NH_2$), a stilbene derivative ligand material represented by a structural formula $P_{3-5}$ is formed through the above synthetic route, where the carboxyl group (—COOH) of $R_{14}$ and the amino group (—$NH_2$) of $R_{15}$ form an amide bond in $L_3$.

($P_{3-5}$)

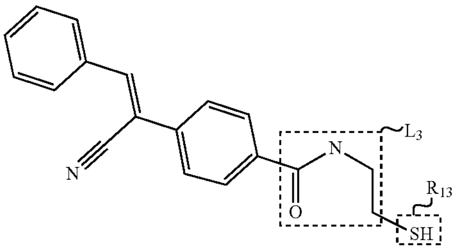

It will be noted that, the above are examples of structures of stilbene derivatives as the ligand material, and the structures of the stilbene derivatives as the ligand material are not limited thereto. The examples use the sulfydryl group (—SH) as the coordination group, because the sulfydryl group (—SH) has strong binding force with the quantum dot body, which may enable formation of a stable coordination bond.

In some examples, an amino group (—$NH_2$) may be used as the coordination group. For example, in a case where values of g, i, and j are 0, a value of h is 1, $R_{10}$ is a cyano group (—CN), $L_3$ is a single bond, and $R_{13}$ is an amino group (—$NH_2$), a structural formula of the ligand material is as shown in $P_{3-6}$ below.

($P_{3\text{-}6}$)

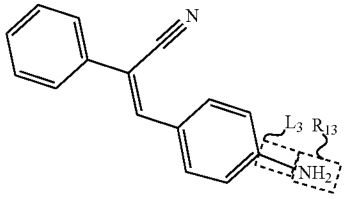

In some examples, similarly, quantum dot materials containing the above stilbene derivative ligand materials are formed by a ligand exchange method. For steps of forming the quantum dot materials containing the stilbene derivative ligand materials by using the ligand exchange method, reference may be made to the above steps S101 to S103, which will not be repeated here.

It will be noted that, the raw material represented by the general formula (XII-2) is also a stilbene derivative. In a case where the substituent $R_{14}$ is a carboxyl group (—COOH), the raw material represented by the general formula (XII-2) is a same material as the ligand material represented by $P_{3\text{-}2}$. In this case, it may be possible to directly coordinate the raw material represented by the structural formula $P_{3\text{-}2}$ with the quantum dot bodies to form a quantum dot material represented by a following structural formula.

($P'_{3\text{-}2}$)

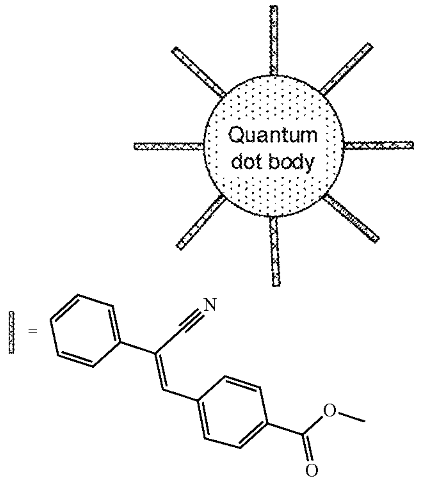

That is to say, the quantum dot body replaces a hydrogen atom of the carboxyl group (—COOH) to form a coordination bond with an oxygen atom therein, so that the connection between the stilbene derivative ligand material and the quantum dot bodies is realized. A structural formula obtained after the hydrogen atom is removed from the carboxyl group (—COOH) of the stilbene derivative represented by the structural formula $P_{3\text{-}2}$ is removed is represented as $P'_3$-2.

A structure of a cross-linked ligand formed by a cycloaddition reaction of the ligand material represented by the general formula (V) under light illumination is described below.

In some examples, the cross-linked ligand formed by the cycloaddition reaction of photosensitive groups of the ligand material represented by general formula (V) under light illumination is any one of cross-linked ligands represented by a following general formula (VI).

(VI)

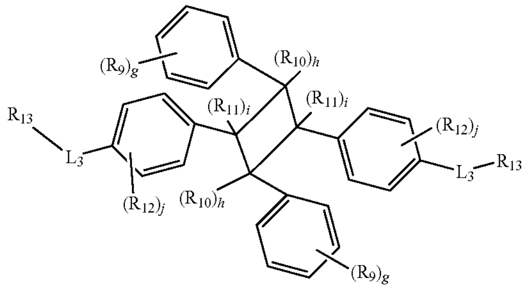

For $R_9$, $R_{10}$, $R_{11}$, $R_1$, $L_3$, g, h, i and j, reference may be made to the description of formula (V) above, which will not be repeated here.

A structure formed by the cross-linked ligand represented by the general formula (VI) and quantum dot bodies is any one of structures represented by a following general formula (IX).

(IX)

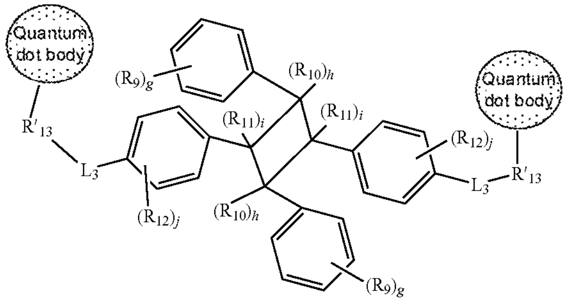

Here, $R'_{13}$ is a group formed be coordination connection between the coordination group $R_{13}$ and the quantum dot body, $R_{13}$ is any one of a sulfhydryl group (—SH), a carboxyl group (—COOH) and an amino group (—$NH_2$), and $R'_{13}$ is any one of structures obtained by removal of a hydrogen atom from the sulfydryl group (—SH), the carboxyl group (—COOH) and the amino group (—$NH_2$).

For example, $R_{13}$ is —SH, and $R'_{13}$ is —S—; or $R_{13}$ is —COOH, and $R'_{13}$ is —COO—; or $R_{13}$ is —$NH_2$, and $R'_{13}$ is —NH—.

That is to say, under ultraviolet (UV) light illumination, a [2+2] cycloaddition reaction occurs between carbon-carbon double bonds of photosensitive groups of adjacent molecules of the stilbene derivative ligand material to form a cyclobutane structure, so that a cross-linked ligand with low solubility in dichloromethane is obtained.

It will be noted that, in order to more clearly show a process of the photocycloaddition reaction of the styrene derivative ligand material, each quantum dot body the general formula (IX) is coordinately bound with one styrene derivative molecule. It will be understood that, each quantum dot body may be coordinately bound with a plurality of styrene derivative molecules, and a cross-linked quantum dot material is formed through a photocycloaddition reaction of styrene derivative ligand material.

For example, considering the ligand material represented by the structural formula $P_{3-2}$ as an example, in a patterning process of forming the functional layer 50 (the functional layer 50 includes the light-emitting layer 101 shown in FIGS. 1 to 3, or the functional layer 50 includes the color film layer 103 shown in FIG. 4) by a direct patterning process, the patterning process of the quantum dot material is as shown in a following formula.

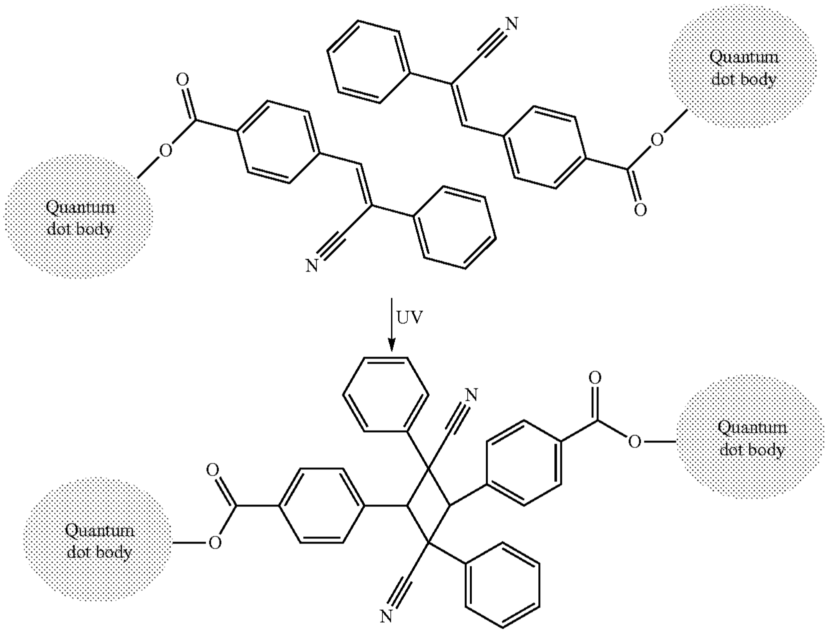

For example, a quantum dot solution of a stilbene derivative ligand material is coated into a film, placed under a mask for exposure by 365 nm ultraviolet (UV) light, immersed in a dichloromethane solution for elution and development, and dried to obtain a patterned functional layer 50 (the functional layer 50 includes the light-emitting layer 101 as shown in FIGS. 1 to 3, or the functional layer 50 includes the color film layer 103 as shown in FIG. 4).

In an exposed region, a [2+2] cycloaddition reaction occurs between photosensitive groups of the stilbene derivative ligand material. As a surface of the quantum dot body contains a plurality of photosensitive groups of the stilbene derivative ligand material, and all photosensitive groups undergo a [2+2] photocycloaddition reaction, cross-linking occurs between quantum dot bodies in the exposed region, which enables a solubility of the quantum dot bodies in a developing solution (such as a dichloromethane solvent) to be reduced. The ligand material in a non-exposed region is unchanged, and no cross-linked ligand is formed. When the developing solution is used for development, the developing solution can wash away the quantum dot material in the non-exposed region, and a cross-linked quantum dot material in the exposed region can be reserved to form a quantum dot pattern consistent with the mask.

A structure of the light-emitting device 10 is described below.

In some embodiments, as shown in FIGS. 1 to 4, the light-emitting device 10 includes the functional layer 50. The functional layer 50 includes a cross-linked quantum dot material formed by the ligand material and the quantum dot bodies of the quantum dot material provided in the above embodiments, and a plurality of quantum dot bodies are bound to the cross-linked ligand formed by the ligand material to form the cross-linked quantum dot material with a network structure.

That is to say, a material of the functional layer 50 of the light-emitting device 10 is a quantum dot material in a cross-linked state formed by cross-linking of the ligand material bound to the quantum dot bodies. The material has low solubility in a dichloromethane solvent as a developing solution, so that the functional layer 50 may be formed by a direct patterning method. The ligand material has any one of the structures represented by the general formulas (I), (III) and (V).

The formed quantum dot material in the cross-linked state has any one of the structures represented by in general formulas (VII), (VIII) and (IX).

In some examples, as shown in FIGS. 1 to 3, the light-emitting device 10 further includes a first electrode 11 and a second electrode 12. The functional layer 50 is a light-emitting layer 101. The light-emitting layer 101 is disposed between the first electrode 11 and the second electrode 12.

For example, as shown in FIG. 1, the first electrode 11 may be one of an anode and a cathode, and the second electrode 12 may be the other one of the anode and the cathode.

In some examples, as shown in FIGS. 1 to 3, the light-emitting layer 101 includes a first sub-pixel light-emitting layer 101*a*, a second sub-pixel light-emitting layer 101*b* and a third sub-pixel light-emitting layer 101*c*. The first sub-pixel light-emitting layer 101*a* is configured to emit one of red light, blue light and green light, the second sub-pixel light-emitting layer 101*b* is configured to emit another one of the red light, the blue light and the green light, and the third sub-pixel light-emitting layer 101*c* is configured to emit a last one of the red light, the blue light and the green light.

For example, the first sub-pixel light-emitting layer 101*a* is configured to emit red light, the second sub-pixel light-emitting layer 101*b* is configured to emit blue light, and the third sub-pixel light-emitting layer 101*c* is configured to emit green light. For example, the first sub-pixel light-emitting layer 101*a*, the second sub-pixel light-emitting layer 101*b* and the third sub-pixel light-emitting layer 101*c* include quantum dot bodies formed by cadmium selenide (CdSe) nanoparticles having different particle diameters, so that full-color display of the light-emitting device 10 may be realized.

For example, a material of the quantum dot body may be at least one of CdS, CdSe, CdTe, ZnSe, InP, PbS, $CuInS_2$, ZnO, $CsPbCl_3$, $CsPbBr_3$, $CsPhI_3$, CdS/ZnS, CdSe/ZnS, ZnSe, InP/ZnS, PbS/ZnS, InAs, InGaAs, InGaN, GaNk, ZnTe, Si, Ge or C. In a case where the material of the quantum dot body is CdS/ZnS, CdSe/ZnS, InP/ZnS or PbS/ZnS, it means that the quantum dot body has a core-shell structure, where one component of the material is a core material, and the other component of the material is a shell material. For example, in a case where the material of the quantum dot body is CdS/ZnS, it means that the core material of the quantum dot is CdS, and the shell material is ZnS.

For light-emitting devices 10 formed by a direct patterning method, a distance between adjacent light-emitting devices 10 is small. For example, the distance is in a range of 10 μm to 20 μm, inclusive. The small distance may enable light-emitting diodes to achieve high resolution, and improve optical performances of the light-emitting diodes.

In some embodiments, as shown in FIG. 2, the light-emitting device 10 further includes at least one of an electron injection layer 13, an electron transport layer 14 and a hole blocking layer 15 that are disposed between the first electrode 11 and the light-emitting layer 101. The electron injection layer 13, the electron transport layer 14 and the hole blocking layer 15 are sequentially stacked in a first direction X, the first direction X being a direction from the first electrode 11 to the light-emitting layer 101.

In some examples, as shown in FIG. 2, the light-emitting device 10 includes the electron injection layer 13, the electron transport layer 14 and the hole blocking layer 15 that are disposed between the first electrode 11 and the light-emitting layer 101. In this case, the first electrode 11 is a cathode, and the electron injection layer 13 and the electron transport layer 14 may improve transport efficiency of electrons.

For example, a material of the electron injection layer 13 may be metal such as Li, Ca or Yb, or a metal salt such as LiF or $LiQ_3$. The material is not limited thereto.

For example, the electron transport layer 14 is a zinc oxide-based nanoparticle film or a zinc oxide film.

For example, a material of the hole blocking layer 15 may be 2,9-dimethyl-4,7-biphenyl-1,10-phenanthroline. The hole blocking layer 15 has a good hole blocking capability.

In some embodiments, as shown in FIG. 2, the light-emitting device 10 further includes at least one of a hole injection layer 16, a hole transport layer 17 and an electron blocking layer 18 that are disposed between the second electrode 12 and the light-emitting layer 101. The hole injection layer 16, the hole transport layer 17 and the electron blocking layer 18 are sequentially stacked in a second direction Y, the second direction Y being a direction from the second electrode 12 to the light-emitting layer 101.

For example, as shown in FIG. 2, the light-emitting device 10 includes the hole injection layer 16, the hole transport layer 17 and the electron blocking layer 18 that are disposed between the second electrode 12 and the light-emitting layer 101. In this case, the second electrode 12 is an anode, and the hole injection layer 16 and the hole transport layer may improve transport efficiency of holes.

For example, a material of the hole injection layer 16 may include poly (3,4-ethylenedioxythiophene), polystyrene sulfonate, or other compounds suitable for the hole injection layer 16.

For example, a material of the hole transport layer 17 may be any one of poly (9,9-dioctylfluorene-co-N-(4-butylphenyl) diphenylamine) (abbreviated as TFB), polyvinyl carbazole (abbreviated as PVK) and other commercialized hole transport compounds.

For example, a material of the electron blocking layer 18 may include 4,4'-cyclohexylbis [N,N-bis(4-methylphenyl) aniline] or 4,4',4"-tris (carbazol-9-yl) triphenylamine. The material is not limited thereto.

By providing at least one of the electron injection layer 13, the electron transport layer 14 or the hole blocking layer 15 and providing at least one of the hole injection layer 16, the hole transport layer 17 or the electron blocking layer 18, it may possible to improve combination and light-emitting efficiency of holes and electrons in the light-emitting layer 101 (a quantum dot layer), which improves light-emitting efficiency of the light-emitting device 10.

In some embodiments, as shown in FIG. 4, the functional layer 50 is a color film layer 103, and the light-emitting device 10 further includes an excitation light source 20. The color film layer 103 is disposed on a light-exit side G of the excitation light source 20.

By providing the color film layer 103, it may be possible to realize color display of the light-emitting device 10.

For example, as shown in FIG. 3, it may be possible to use a quantum dot light-emitting diode as the excitation light source 20. A material of the light-emitting layer 101 of the quantum dot light-emitting diode has any one of the structures represented by the general formulas (VII), (VIII) and (IX).

For example, as shown in FIG. 4, some other light-emitting diode device may be used as the excitation Light source 20. For example, the some other light-emitting diode device may be a mini light-emitting diode (mini-LED), a micro light-emitting diode (micro-LED) or an organic light-emitting diode (OLED). The light-emitting device 10 that is formed by the color film layer 103 formed by the functional layer 50 and the organic light-emitting diode OLED is a quantum dot organic light-emitting diode (QDOLED).

A method for manufacturing a light-emitting device is described below.

Figure 6:
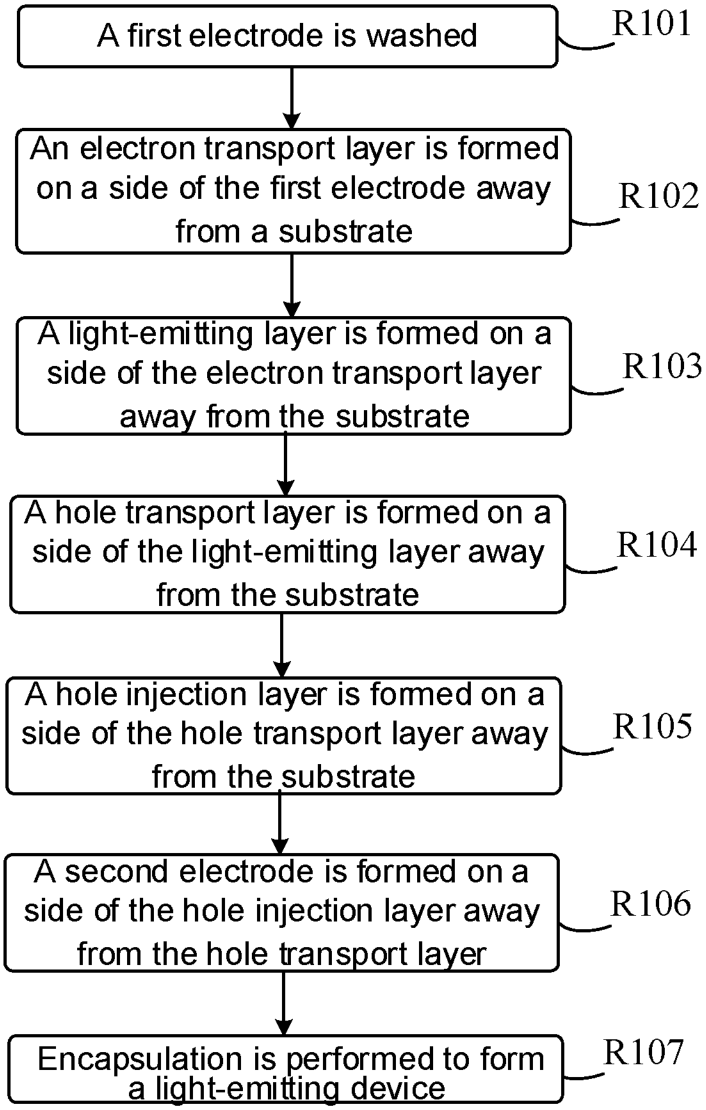
FIG. 6 is a flowchart of a method for manufacturing a light-emitting device, in accordance with some embodiments of the present disclosure.
Figure 7:
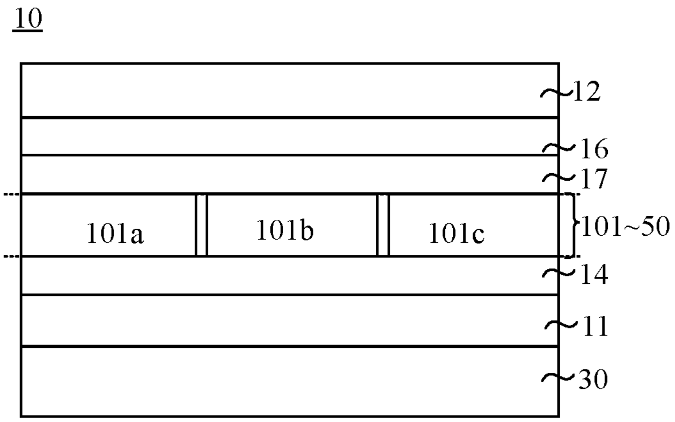
FIG. 7 is a structural diagram of yet another light-emitting device, in accordance with some embodiments of the present disclosure.

In some examples, the method for manufacturing the light-emitting device includes the following steps R101 to R107 as shown in FIG. 6. A structure of the light-emitting device 10 is as shown in FIG. 7.

In R101, the first electrode 11 is washed.

For example, a material of the first electrode 11 is indium tin oxide (ITO). The first electrode 11 is disposed on a substrate 30 (generally referred to as conductive glass).

For example, ultrasonic cleaning is performed three times with water and isopropanol, and sterilization is performed with ultraviolet (UV) light for 10 min.

For example, the second electrode 11 is a cathode.

For example, the substrate 30 is a glass substrate. Alternatively, the substrate 30 may be an array substrate. The array substrate includes a thin film transistor (TFT) array. For example, the array substrate includes a base and an active layer, a gate insulating layer, a gate metal layer, an interlayer insulating layer, a source-drain metal layer and a planarization layer that are sequentially stacked on the base.

The first electrode 11 is disposed on a side of the planarization layer away from the base.

In R102, an electron transport layer 14 is formed on a side of the first electrode 11 away from the substrate 30.

For example, the electron transport layer 14 is a zinc oxide-based nanoparticle film formed by zinc oxide-based nanoparticles, or the electron transport layer 14 is a zinc oxide film formed by zinc oxide.

For example, a material of the electron transport layer 14 is a zinc oxide film. Steps of forming the zinc oxide film are as follows. 1 g of zinc acetate is dissolved in 5 mL of a mixed solution of ethanolamine and n-butyl alcohol to form a precursor solution, the conductive glass is placed in a spin coater, 90 μL to 120 μL of the precursor solution is added dropwise onto the conductive glass, spin coating is performed, the conductive glass is placed on a hot stage at 150° C. to 180° C. for heating for several minutes to evaporate a solvent, and then the electron transport layer 14 is obtained.

In R103, a light-emitting layer 101 is formed on a side of the electron transport layer 14 away from the substrate 30.

For example, the light-emitting layer 101 includes a first sub-pixel light-emitting layer 101*a*, a second sub-pixel light-emitting layer 101*b* and a third sub-pixel light-emitting layer 101*c*. The first sub-pixel light-emitting layer 101*a* configured to emit red light, the second sub-pixel light-emitting layer 101*b* configured to emit blue light, and the third sub-pixel light-emitting layer 101*c* configured to emit green light.

Figure 8:
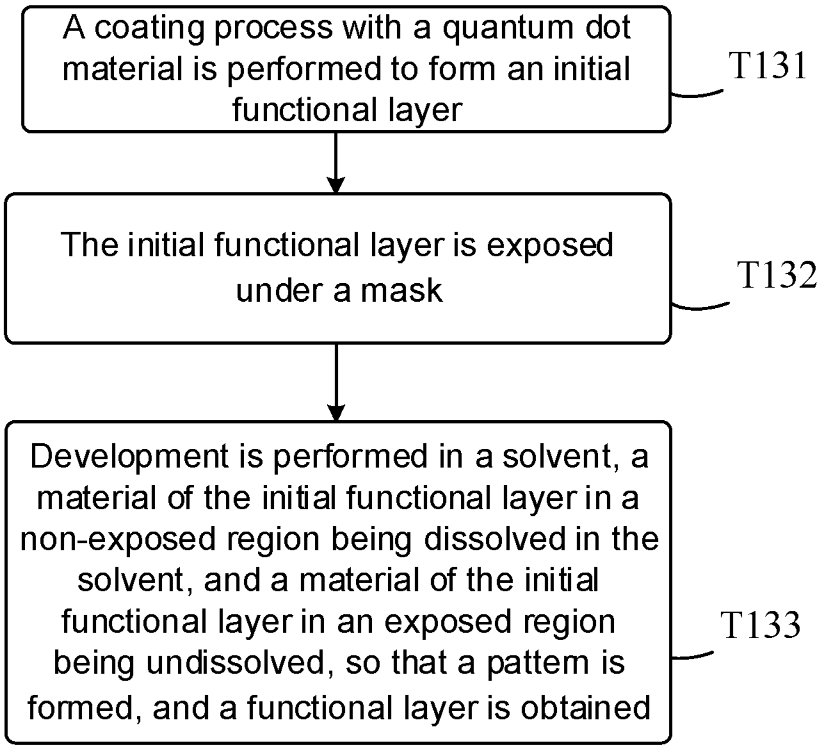
FIG. 8 is a flowchart of a direct patterning method for forming a functional layer, in accordance with some embodiments of the present disclosure.

First, a process of forming the first sub-pixel light-emitting layer 101*a* by a direct patterning method is described. As shown in FIG. 8, the process includes following steps T131 to T133.

In T131, a coating process with a quantum dot material is performed to form an initial functional layer.

For example, a ligand material of the quantum dot material has any one of structures represented by the general formulas (I), (III) and (V) above.

For example, the ligand material adopts the coumarin derivative as shown in the structural formula $P_{1-1}$. A red quantum dot (a quantum dot body) solution of the coumarin derivative ligand material is coated (2000 rpm/30s, 15 mg/mL) to form the initial functional layer, i.e. an initial light-emitting layer.

In T132, the initial functional layer is exposed under a mask.

For example, the initial functional layer is placed under the mask and exposed for 40s by using a 365 nm UV lamp (at a total dose of 100 $mJ/cm^2$).

In this process, the ligand material in an exposed region undergoes a photocycloaddition reaction. For a process of the photocycloaddition reaction of the ligand material under ultraviolet (UV) light, reference may be made to the content above, which will not be repeated above.

In T133, development is performed in a solvent, a material of the initial functional layer in a non-exposed region is dissolved in the solvent, and a material of the initial functional layer in the exposed region is undissolved, so that a pattern is formed, and the functional layer 50 is obtained.

Thus, the light-emitting layer 101 is obtained.

For example, the initial functional layer is immersing in a polar solution for elution and development, and then dried, so that a patterned light-emitting layer 101 is obtained.

A material of the light-emitting layer 101 is a quantum dot material formed in a cross-linked state. Corresponding to the material of the ligand material, the material of the light-emitting layer 101 may be any one of materials having the structures represented by the general formulas (VII), (VIII) and (IX).

It will be noted that, the two materials corresponding to each other refer to that, the quantum dot material in the cross-linked state is a product obtained by photocycloaddition of the ligand material of the quantum dot material after coating of the quantum dot material.

In some examples, as shown in FIG. 3, the second sub-pixel light-emitting layer 101*b* and the third sub-pixel light-emitting layer 101*c* may each be formed by the direct patterning method above. Ligand materials selected for the second sub-pixel light-emitting layer 101*b* and the third sub-pixel light-emitting layer 101*c* may be same as or different from the ligand material selected for the first sub-pixel light-emitting layer 101*a*.

It will be noted that, in the second sub-pixel light-emitting layer 101*b* and the third sub-pixel light-emitting layer 101*c*, a mass ratio of ligand material to quantum dot bodies may be in a range of 1:10 to 3:20, inclusive. For example, the mass ratio of the ligand material to the quantum dot bodies is 1:10, 1:8 or 3:20. The mass ratio is not limited thereto. Such a design may meet requirements that the original ligand material on the quantum bodies are fully replaced by the ligand material, and a cross-linked ligand with sufficiently low solubility is formed, which prevents a cross-linked quantum dot material from being dissolved in a polar solvent.

In R104, a hole transport layer 17 is formed on a side of the light-emitting layer 101 away from the substrate 30.

For example, a material of the hole transport layer 17 may be any one of poly (9,9-dioctylfluorene-co-N-(4-butylphenyl) diphenylamine) (abbreviated as TFB), polyvinyl carbazole (abbreviated as PVK) and other commercialized hole transport compounds.

For example, the hole transport layer 17 is formed by spin coating or evaporation deposition on the side of the light-emitting layer 101 away from the substrate 30. For example, conditions for forming the hole transport layer 17 by using the material poly (9, 9-dioctylfluorene-co-N-(4-butylphenyl) diphenylamine) (abbreviated as TFB) are as follows: forming a film in inert gas at 130° C. to 150° C., where s thickness of the film may be regulated and controlled according to a rotating speed of a spin coater.

In R105, a hole injection layer 16 is formed on a side of the hole transport layer 17 away from the substrate 30.

For example, a material of the hole injection layer 16 may be poly (3,4-ethylenedioxythiophene)-poly (styrenesulfonate) (abbreviated as PEDOT: PSS 4083) or other commercially available compounds suitable for the hole injection layer 16.

For example, the hole injection layer 16 is formed by spin coating or evaporation deposition on the side of the hole transport layer 17 away from the substrate 30.

For example, conditions for forming the hole injection layer 16 by using the material poly (3,4-ethylenedioxythiophene)-poly (styrenesulfonate) (abbreviated as PEDOT: PSS 4083) are as follows: forming a film in air at 130° C. to 150° C., where a thickness of the film may be regulated and controlled according to a rotating speed of a spin coater.

In R106, a second electrode 12 is formed on a side of the hole injection layer 16 away from the hole transport layer 17.

For example, the second electrode 12 is a cathode.

For example, a material of the second electrode 12 is aluminum (Al), silver (Ag) or indium zinc oxide (IZO).

For example, the second electrode 12 is formed by evaporation deposition.

In R107, encapsulation is performed to form the light-emitting device 10.

For example, an encapsulation cover plate is added, and the light-emitting device is encapsulated by means of an ultraviolet (UV) curing adhesive, so that a full-color light-emitting device 10 is obtained.

In some embodiments, as shown in FIG. 4, the light-emitting functional layer 50 is a color film layer 103. The color film layer 103 is disposed on a light-exit side G of an excitation light source 20. The method for manufacturing the light-emitting device 10 includes: forming the excitation light source 20, and forming the color film layer 103 on the light-exit side G of the excitation light source 20.

For example, the excitation light source 20 may be a light-emitting diode device. A light-emitting layer of the light-emitting diode device is formed by a lithography method. The light-emitting diode device includes a mini light-emitting diode (mini-LED), a micro light-emitting diode (micro-LED) or an organic light-emitting diode (OLED).

For example, the color film layer 103 is formed by a direct patterning method. For steps of the method, reference may be made to the steps T131 to T133 above. The method includes following steps T131' to T133'.

In T131', a coating process with a quantum dot material is performed to form an initial color film layer.

For example, a ligand material of the quantum dot material has any one of the structures shown in the general formulas (I), (III) and (V) above.

In T132', the initial color film layer is exposed under a mask.

For example, the initial functional layer is placed under the mask and exposed for s by using a 365 nm UV lamp (at a total dose of 100 mJ/$cm^2$).

In this process, the ligand material in an exposed region undergoes a photocycloaddition reaction. For a process of the photocycloaddition reaction of the ligand material under ultraviolet (UV) light, reference may be made to the content above, which will not be repeated above.

In T133', development is performed in a solvent, a material of the initial functional layer in a non-exposed region is dissolved in the solvent, and a material of the initial functional layer in the exposed region is undissolved, so that a pattern is formed, and the color film layer 103 is obtained.

For example, the initial functional layer is immersing in a polar solution for elution and development, and then dried, so that a patterned color film layer 103 is obtained. It will be noted that, the formed quantum dot material in a cross-linked state has any one of the structures represented by in general formulas (VII), (VIII) and (IX).

Since the color film layer 103 is formed by the direct patterning method, no additive is required to be added, which prevents an additive affecting optical properties of the color film layer 103; and moreover, it may be possible to make manufacture of light-emitting devices 10 simple and efficient and reduce process flows.

Figure 9:
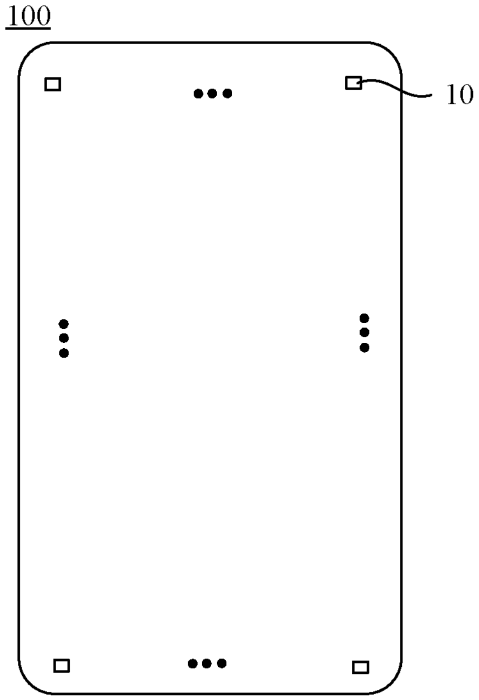
FIG. 9 is a structural diagram of a display substrate, in accordance with some embodiments of the present disclosure.

Some embodiments of the present disclosure provide a display substrate 100. As shown in FIG. 9, the display substrate 100 includes light-emitting devices 10 each as described in any one of the above embodiments.

Beneficial effects of the display substrate 100 are same as the beneficial effects of the light-emitting device 10 provided in the second aspect of the present disclosure, which will not be repeated here.

Figure 10:
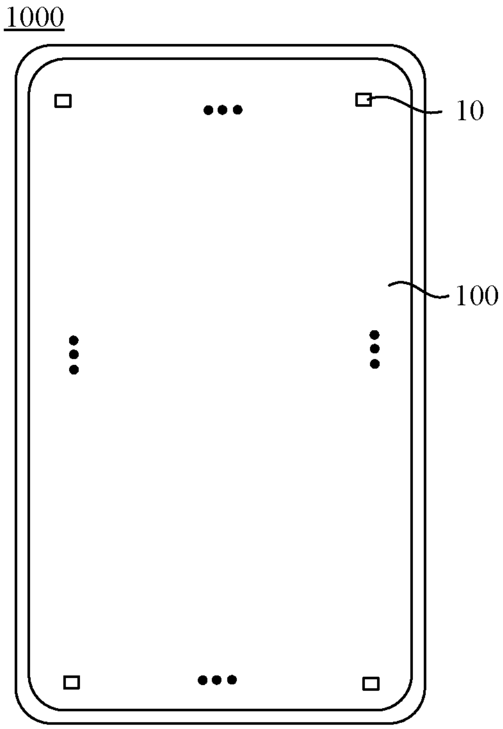
FIG. 10 is a structural diagram of a display apparatus, in accordance with some embodiments of the present disclosure.

Some embodiments of the present disclosure provide a display apparatus 1000. As shown in FIG. 10, the display apparatus 1000 includes the display substrate 100.

The display apparatus 1000 may be any apparatus that displays images whether in motion (e.g., videos) or stationary (e.g., still images) and whether text or images. More specifically, it is anticipated that the embodiments may be implemented in a variety of electronic apparatuses or associated with a variety of electronic apparatuses. The variety of electronic apparatuses include (but are not limited to) a mobile phone, a wireless apparatus, a personal digital assistant (PDA), a hand-held or portable computer, a global positioning system (GPS) receiver/navigator, a camera, an moving picture experts group 4 (MP4) video player, a video camera, a game console, a watch, a clock, a calculator, a television monitor, a flat panel display, a computer monitor, an automobile display (e.g., an odometer display), a navigator, a cockpit controller and/or display, a display of camera views (e.g., a display of a rear-view camera in a vehicle), an electronic photo, an electronic billboard or sign, a projector, a building structure, a packaging and aesthetic structure (e.g., a display for displaying an image of a piece of jewelry), etc.

In some examples, in a case where the display apparatus 1000 is an electroluminescent display apparatus, the electroluminescent display apparatus may be an organic electroluminescent display apparatus or a quantum dot electroluminescent display apparatus.

Beneficial effects of the display apparatus 1000 are same as the beneficial effects of the light-emitting device 10 provided in the second aspect of the present disclosure, which will not be repeated here.

The foregoing descriptions are merely specific implementations of the present disclosure. However, the protection scope of the present disclosure is not limited thereto.

Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A quantum dot material, comprising:

quantum dot bodies and a ligand material coordinated to the quantum dot bodies, wherein the ligand material includes a coordination group and a photosensitive group bound to the coordination group; the photosensitive group is configured to undergo a cycloaddition reaction under light illumination to form a cross-linked ligand; and a solubility of the cross-linked ligand in a solvent is less than a solubility of the ligand material in the solvent.

2. The quantum dot material according to claim 1, wherein the ligand material is any one of materials represented by a following general formula (I):

(I)

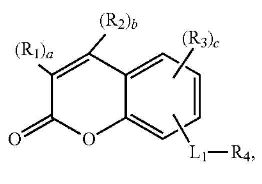

wherein $R_1$, $R_2$ and $R_3$ are same or different, and are each independently any one of fluorine, chlorine, bromine, a methoxyl group and a cyano group;

$L_1$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$;

$R_4$ is any one of a sulfhydryl group, a carboxyl group and an amino group, and $R_4$ is the coordination group for being coordinately bound to the quantum dot body; and values of a and b are each independently any one of 0 and 1, and a value of c is any one of 0, 1, 2 and 3.

3. The quantum dot material according to claim 2, wherein the cross-linked ligand formed by the cycloaddition reaction of photosensitive groups of the ligand material represented by the general formula (I) under light illumination is any one of cross-linked ligands represented by a following general formula (II):

(II)

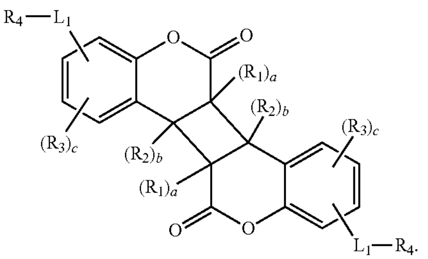

4. The quantum dot material according to claim 1, wherein the ligand material is any one of materials represented by a following general formula (III):

(III)

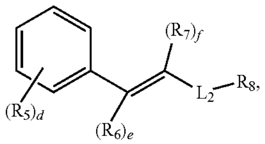

wherein $R_5$ is any one of fluorine, chlorine, bromine, a methoxyl group and a cyano group;

$R_6$ and $R_7$ are same or different, and at least one of $R_6$ and $R_7$ is a cyano group;

$L_2$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$;

$R_8$ is any one of a sulfhydryl group, a carboxyl group and an amino group, and $R_8$ is the coordination group for being coordinately bound to the quantum dot body;

a value of d is any one of 0, 1, 2, 3, 4 and 5; and values of e and f are each independently any one of 0 and 1.

5. The quantum dot material according to claim 4, wherein the cross-linked ligand formed by the cycloaddition reaction of photosensitive groups of the ligand material represented by the general formula (III) under light illumination is any one of cross-linked ligands represented by a following general formula (IV):

(IV)

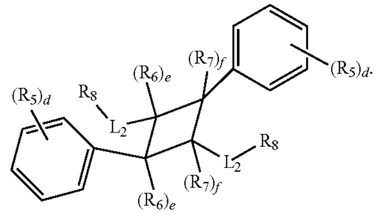

6. The quantum dot material according to claim 1, wherein the ligand material is any one of materials represented by a following general formula (V):

(V)

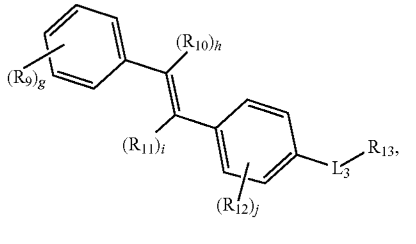

wherein $R_9$ and $R_{12}$ are same or different, and are each independently any one of fluorine, chlorine, bromine, a methoxyl group and a cyano group;

$R_{10}$ and $R_{11}$ are same or different, and at least one of $R_{10}$ and $R_{11}$ is a cyano group;

$L_3$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$;

$R_{13}$ is any one of a sulfhydryl group, a carboxyl group and an amino group, and $R_{13}$ is the coordination group for being coordinately bound to the quantum dot body;

a value of g is any one of 0, 1, 2, 3, 4 and 5;

a value of j is any one of 0, 1, 2, 3 and 4; and values of h and i are each independently any one of 0 and 1.

7. The quantum dot material according to claim 6, wherein the cross-linked ligand formed by the cycloaddition reaction of photosensitive groups of the ligand material represented by the general formula (V) under light illumination is any one of cross-linked ligands represented by a following general formula (VI):

(VI)

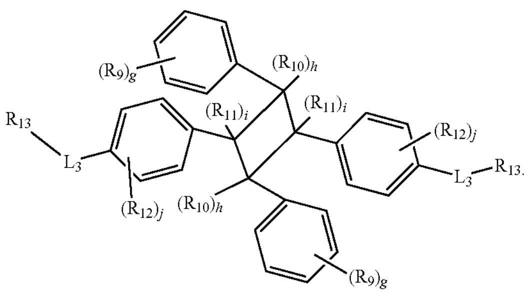

8. The quantum dot material according to claim 1, wherein a mass ratio of the ligand material to the quantum dot body is in a range of 1:10 to 3:20, inclusive.

9. The quantum dot material according to claim 1, wherein the solvent includes dichloromethane; and/or the photosensitive group of the ligand material is configured to undergo the cycloaddition reaction under ultraviolet light illumination.

10. A light-emitting device, comprising a functional layer, the function layer including a cross-linked quantum dot material formed by the ligand material and quantum dot bodies of the quantum dot material according to claim 1, wherein the quantum dot bodies are bound to the cross-linked ligand formed by the ligand material to form the cross-linked quantum dot material with a network structure.

11. The light-emitting device according to claim 10, wherein a structure of the cross-lined quantum dot material formed by the cross-linked ligand and the quantum dot bodies is any one of structures represented by a following general formula (VII):

(VII)

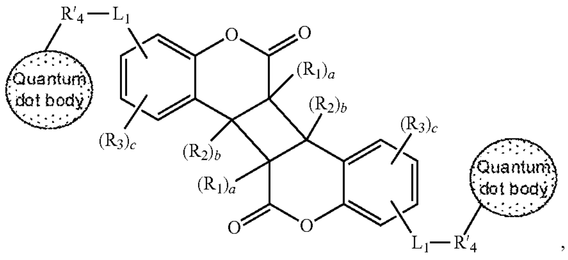

, wherein $R_1$, $R_2$ and $R_3$ are same or different, and are each independently any one of fluorine, chlorine, bromine, a methoxy group and a cyano group, $L_1$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$, $R'_4$ is a group formed by coordination connection between a coordination group $R_4$ and a quantum dot body, $R_4$ is any one of a sulfhydryl group, a carboxyl group and an amino group, and $R'_4$ is a structure formed by removal of a hydrogen atom from any one of the sulfhydryl group, the carboxyl group and the amino group; and values of a and b are each independently 0 or 1, and a value of c is any one of 0, 1, 2 and 3.

12. The light-emitting device according to claim 10, wherein a structure of the cross-linked quantum dot material formed by the cross-linked ligand and the quantum dot bodies is any one of structures represented by a following general formula (VIII):

(VIII)

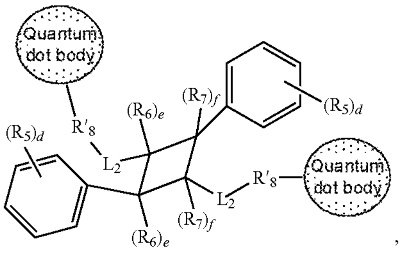

, wherein $R_5$ is any one of fluorine, chlorine, bromine, a methoxyl group and a cyano group, $R_6$ and $R_7$ are same or different, and at least one of $R_6$ and $R_7$ is a cyano group;

$L_2$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$;

$R'_8$ is a group formed by coordination connection between a coordination group $R_8$ and a quantum dot body, $R_8$ is any one of a sulfhydryl group, a carboxyl group and an amino group, and R's is a structure formed by removal of a hydrogen atom from any one of the sulfhydryl group, the carboxyl group and the amino group;

a value of d is any one of 0, 2, 3, 4 and 5, and values of e and f are each independently 0 or 1.

13. The light-emitting device according to claim 10, wherein a structure of the cross-linked quantum dot material formed by the cross-linked ligand and the quantum dot bodies is any one of structures represented by a following general formula (IX):

(IX)

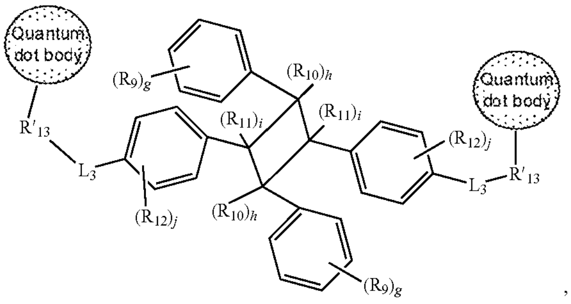

, wherein $R_9$ and $R_{12}$ are same or different, and are each interpedently any one of fluorine, chlorine, bromine, a methoxyl group and a cyano group;

$R_{10}$ and $R_{11}$ are same or different, and at least one of $R_{10}$ and $R_{11}$ is a cyano group;

$L_3$ is any one of a single bond, an ester bond with a carbon chain of $C_1$ to $C_{20}$, an amido bond with a carbon chain of $C_1$ to $C_{20}$ and an ether bond with a carbon chain of $C_1$ to $C_{20}$;

$R'_{13}$ is a group formed by coordination connection between a coordination group $R_{13}$ and a quantum dot body, $R_{13}$ is any one of a sulfhydryl group, a carboxyl group and an amino group, and $R'_{13}$ is a structure formed by removal of a hydrogen atom from any one of the sulfhydryl group, the carboxyl group and the amino group, a value of g is any one of 0, 2, 3, 4 and 5;

a value of j is any one, 0, 1, 2, 3 and 4; and values of h and i are each independently 0 or 1.

14. The light-emitting device according to claim 10, further comprising a first electrode and a second electrode, wherein the functional layer is a light-emitting layer and disposed between the first electrode and the second electrode; and the light-emitting layer includes a first sub-pixel light-emitting layer, a second sub-pixel light-emitting layer and a third sub-pixel light-emitting layer, wherein the first sub-pixel light-emitting layer is configured to emit one of red light, blue light and green light; the second sub-pixel light-emitting layer is configured to emit another one of the red light, the blue light and the green light; and the third sub-pixel light-emitting layer is configured to emit a last one of the red light, the blue light and the green light.

15. The light-emitting device according to claim 14, further comprising a color film layer, the color film layer being disposed on a light-exit side of the light-emitting layer.

16. The light-emitting device according to claim 10, wherein the functional layer is a color film layer, the light-emitting device further comprises an excitation light source, and the color film layer is disposed on a light-exit side of the excitation light source.

17. The light-emitting device according to claim 16, wherein the excitation light source includes a light-emitting diode device.

18. A method for manufacturing a light-emitting device, comprising: forming a functional layer, wherein forming the functional layer includes:

performing a coating process with a quantum dot material to form an initial functional layer, wherein the quantum dot material is the quantum dot material according to claim 1;

performing an exposure process on the initial functional layer by using a mask; and performing a development process with a solvent, a material of the initial functional layer in a non-exposed region being dissolved in the solvent, and a material of the initial functional layer in an exposed region being undissolved in the solvent, so that a pattern is formed to obtain the functional layer.

19. The method for manufacturing the light-emitting device according to claim 18, wherein before forming the functional layer, the method further comprises: performing a ligand material exchange process, wherein performing the ligand material exchange process includes:

preparing an initial solution, the initial solution including a quantum dot body containing an original ligand material;

adding a solution containing the ligand material to the initial solution; and replacing the original ligand material, by the ligand material, on the quantum dot body, so that the coordination group of the ligand material is bound to the quantum dot body to obtain the quantum dot material.

20. A display apparatus, comprising light-emitting devices each according to claim 10.

* * * * *